US009036397B2

(12) United States Patent
Chien et al.

(10) Patent No.: US 9,036,397 B2
(45) Date of Patent: *May 19, 2015

(54) RESISTIVE MEMORY ARRAY AND METHOD FOR CONTROLLING OPERATIONS OF THE SAME

(71) Applicant: MACRONIX International Co., Ltd., Hsinchu (TW)

(72) Inventors: Wei-Chih Chien, Hsinchu (TW); Ming-Hsiu Lee, Hsinchu (TW); Feng-Ming Lee, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 307 days.

This patent is subject to a terminal disclaimer.

(21) Appl. No.: 13/624,761

(22) Filed: Sep. 21, 2012

(65) Prior Publication Data

US 2013/0028005 A1 Jan. 31, 2013

Related U.S. Application Data

(63) Continuation-in-part of application No. 12/753,316, filed on Apr. 2, 2010, now Pat. No. 8,295,075.

(51) Int. Cl.
*G11C 11/00* (2006.01)
*G11C 13/00* (2006.01)
*G11C 11/56* (2006.01)
*H01L 45/00* (2006.01)
*H01L 27/24* (2006.01)

(52) U.S. Cl.
CPC .......... *G11C 13/004* (2013.01); *G11C 11/5614* (2013.01); *G11C 11/5685* (2013.01); *G11C 13/0007* (2013.01); *G11C 13/0011* (2013.01); *G11C 13/0069* (2013.01); *G11C 2213/51* (2013.01); *G11C 2213/71* (2013.01); *H01L 45/085* (2013.01); *H01L 45/1233* (2013.01);

(Continued)

(58) Field of Classification Search
USPC ........................................................ 365/148
See application file for complete search history.

(56) References Cited

U.S. PATENT DOCUMENTS 5,858,867 A * 1/1999 Hsia et al. ...................... 438/592
5,929,723 A * 7/1999 Kimura et al. ................. 333/193

(Continued)

FOREIGN PATENT DOCUMENTS

TW 200947678 11/2009

OTHER PUBLICATIONS

"Office Action of Taiwan Counterpart Application", issued on Feb. 5, 2015, p1-p6, in which the listed reference was cited.

*Primary Examiner* — Hoai V Ho
*Assistant Examiner* — Pablo Huerta
(74) *Attorney, Agent, or Firm* — J.C. Patents

(57) ABSTRACT

A resistive memory and a method for controlling operations of the resistive memory are provided. The resistive memory has a first memory layer, a second memory layer and a medium layer. Each of the first memory layer and the second memory layer is used to store data. The medium layer is formed between the first memory layer and the second memory layer. The method comprises at least a step of measuring a resistance between the first memory layer and the second memory layer, and determining which one of a first state, a second state and a third state is a state of the resistive memory according to the measured resistance. A resistive memory array including an array of the above resistive memory units, word lines and bit lines is also described, wherein the word (bit) lines are coupled to the first (second) memory layers.

16 Claims, 26 Drawing Sheets

(52) U.S. Cl.
 CPC .......... *H01L 45/1266* (2013.01); *H01L 45/146*
 (2013.01); *H01L 27/2463* (2013.01)

(56) References Cited

U.S. PATENT DOCUMENTS

| | | | |
|---|---|---|---|
| 8,295,075 B2 * | 10/2012 | Chien et al. | 365/148 |
| 2006/0032757 A1 * | 2/2006 | Brevnov et al. | 205/205 |
| 2008/0273378 A1 * | 11/2008 | Philipp et al. | 365/163 |
| 2009/0279349 A1 * | 11/2009 | Shih et al. | 365/163 |
| 2010/0096609 A1 * | 4/2010 | Kim et al. | 257/2 |
| 2010/0110764 A1 * | 5/2010 | Sun et al. | 365/148 |
| 2010/0124805 A1 * | 5/2010 | Na et al. | 438/216 |
| 2010/0301988 A1 * | 12/2010 | Czubatyj et al. | 338/13 |
| 2011/0242874 A1 * | 10/2011 | Chien et al. | 365/148 |

* cited by examiner

RESISTIVE MEMORY ARRAY AND METHOD FOR CONTROLLING OPERATIONS OF THE SAME

CROSS-REFERENCE TO RELATED APPLICATION

This application is a continuation-in-part (CIP) application of and claims priority benefit of U.S. patent application Ser. No. 12/753,316, filed on Apr. 2, 2010 and now allowed. The entirety of the above patent application is hereby incorporated by reference herein and made a part of this specification.

BACKGROUND OF THE INVENTION

1. Field of Invention

The present invention is related to a resistive memory and a method for controlling operations of the resistive memory, and more specifically, to a resistive memory and a method for controlling operations of the resistive memory, where the resistive memory has two memory layers for storing data. The present invention is also related to a resistive memory array based on the above resistive memory, and a method for controlling operations of the resistive memory array.

2. Description of Related Art

Along with the development of the communication technology and the popularity of the Internet, the demands initiated by the public for the communication and processing of the information especially on the audio-video data transmission of great capacity and quick transmission speed are growing. On the other aspect, under the global competition, the work environment is not limited to the office but anywhere in the world at any time, and a great deal of information is needed to support this action and decision. Therefore, the requirements for portable digital apparatuses including the mobile platforms such as a digital notebook computer/NB, a personal digital assistant/PDA, an electronic book/e-book, a mobile phone, and a digital still camera/DSC are increasing significantly. Correspondingly, the requirements for accessing the above digital products through the storage apparatuses are greatly enhanced as well.

Since 1990, the semiconductor storage-based memory is developed, which now becomes a new technology of the storage medium. In order to satisfy the increasing requirements for memories along with the storage or transmission of a great deal of data, developing a new type of the memory device is of great importance and value. One of the new type memory devices is resistive memory, which stores data by adjusting the resistance of a memory layer thereof. Since the conventional resistive memory has a single memory layer for storing data, the data amount could be stored thereof is limited extremely.

SUMMARY OF THE INVENTION

Accordingly, an object of an embodiment of the present invention is to provide a method for controlling operations of a resistive memory. The resistive memory has a first memory layer, a second memory layer and a medium layer. The medium layer is formed between the first memory layer and the second memory layer. The method comprises at least a step of (a) measuring a resistance between the first memory layer and the second memory layer, and determining which one of a first state, a second state and a third state is a state of the resistive memory according to the measured resistance.

A further object of an embodiment of the present invention is to provide a resistive memory. The resistive memory has a first solid electrolyte, a second solid electrolyte and an oxidizable electrode. The oxidizable electrode is formed between the first solid electrolyte and the second solid electrolyte. The first solid electrolyte and the second solid electrolyte are made of transition metal oxide or materials containing at least one chalcogenide element.

A further object of an embodiment of the present invention is to provide a resistive memory. The resistive memory has a first barrier layer, a second barrier layer and a metal oxide layer. The metal oxide layer is formed between the first barrier layer and the second barrier layer. A first active region is formed between the first barrier layer and the metal oxide layer, and a second active region is formed between the second barrier layer and the metal oxide layer.

A further object of an embodiment of the present invention is to provide a memory device. The memory device comprises a first memory layer, a second memory layer, and a medium layer. The first memory layer has M resistive states, and the second memory layer has N resistive states. M is larger than or equal to 3. The medium layer is formed between the first and second memory layers. At least (M+N−1) resistive states of the memory states are distinguishable according to a resistance between the first memory layer and second memory layer.

In an embodiment of the present invention, the step (a) comprises measuring the resistance as a first resistance by applying a first voltage to the resistive memory; determining that the state of the resistive memory is the first state when the first resistance is equal to a predetermined value; measuring the resistance as a second resistance by applying a second voltage to the resistive memory when the first resistance is different from the predetermined value; and determining that the state of the resistive memory is the second state when the second resistance is equal to the first resistance, or determining that the state of the resistive memory is the third state when the second resistance is not equal to the first resistance.

In an embodiment of the present invention, the method further comprises reprogramming the resistive memory to be at the third state when the state of the resistive memory is determined as the third state.

In the embodiments of the present invention, the resistive memory has two memory layers, each of which is capable of storing data. Accordingly, the total data amount could be stored by the resistive memory is increased.

A further object of an embodiment of the present invention is to provide a resistive memory array that includes a plurality of resistive memory units arranged in rows and columns, a plurality of word lines, and a plurality of bit lines. Each resistive memory unit includes a first memory cell, and a second memory cell disposed under and electrically connected in series with the first memory cell. Each word line is coupled to the first memory cells of a row of the resistive memory units. Each bit line is coupled to the second memory cells of a column of the resistive memory units.

In an embodiment of the present invention, each resistive memory unit in the above resistive memory array may be the above resistive memory having a first solid electrolyte, a second solid electrolyte and an oxidizable electrode, or the above resistive memory having a first barrier layer, a second barrier layer and a metal oxide layer.

In a case where each resistive memory unit has a first solid electrolyte, a second solid electrolyte and an oxidizable electrode, the method for controlling operations of the resistive memory array includes: (a) selecting, via a word line and a bit line, a resistive memory unit to be operated; and (b) measuring the resistance of the selected resistive memory unit and determining which one of a first state, a second state and a third state is the state of the selected memory unit according to the measured resistance.

In a case where each resistive memory unit has a first barrier layer, a second barrier layer and a metal oxide layer, the method for controlling operations of the resistive memory array includes: (a) programming the resistive memory array such that in each resistive memory unit, the first memory cell and the second memory cell are not simultaneously at their low-resistance states; (b) selecting, via a word line and a bit line, a resistive memory unit to be operated; and (c) measuring the resistance of the selected resistive memory unit, and determining which one of a first state and a second state is the state of the selected resistive memory unit according to the measured resistance.

In order to make the aforementioned and other objects, features and advantages of the present invention comprehensible, several preferred embodiments accompanied with figures are described in detail below.

It is to be understood that both the foregoing general description and the following detailed description are exemplary, and are not intended to limit the scope of the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
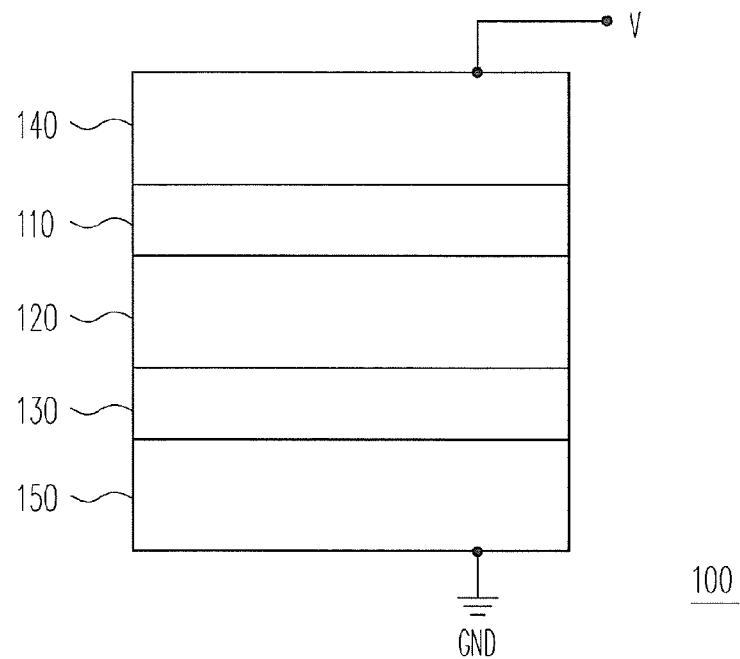
FIGS. 1-3 are structural diagrams of resistive memories of different embodiments of the present invention.

Please refer to FIG. 1, which is a structural diagram of a resistive memory 100 of an embodiment of the present invention. The resistive memory 100 has a first memory layer 110, a medium layer 120, and a second memory layer 130. A first biasing layer 140 is formed on the first memory layer 110, and the second memory layer 130 is formed on a second biasing layer 150. In the embodiment of the present invention, a voltage V is applied to the first biasing layer 140, and the second biasing layer 150 is grounded. However, the present invention is not limited thereto. For example, in an embodiment of the present invention, a voltage source is used to control and adjust the voltage gap between the first biasing layer 140 and the second biasing layer 150 while the second biasing layer 150 is not grounded. The value of the applied voltage V could be positive or negative.

When the voltage V varies, the resistances of the first memory layer 110 and the second memory layer 130 may change accordingly. Therefore, the data stored by the first memory layer 110 and the second memory layer 130 can be adjusted (i.e. programmed or erased) by applying the voltage V.

Figure 2:
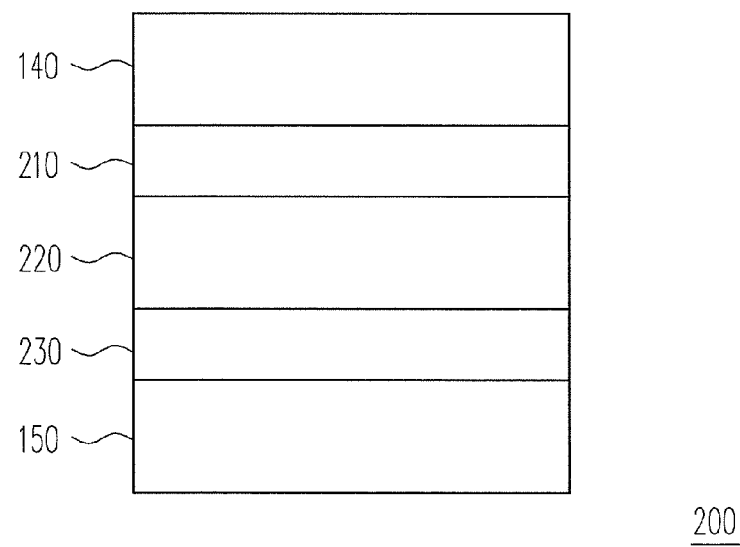

Please refer to FIG. 2, which is a structural diagram of a resistive memory 200 of an embodiment of the present invention. The resistive memory 200 also has a first memory layer 210, a medium layer 220, and a second memory layer 230. The medium layer 220 is formed between the first memory layer 210 and the second memory layer 230. In the embodiment, each of the first memory layer 210 and the second memory layer 230 is a solid electrolyte, and the medium layer 220 is an oxidizable electrode. The solid electrolytes 210 and 230 could be transition metal oxide or materials containing at least one chalcogenide element. The oxidizable electrode 220 is made of a material selected from a group consisting of silver (Ag), copper (Cu), and zinc (Zn).

Figure 3:
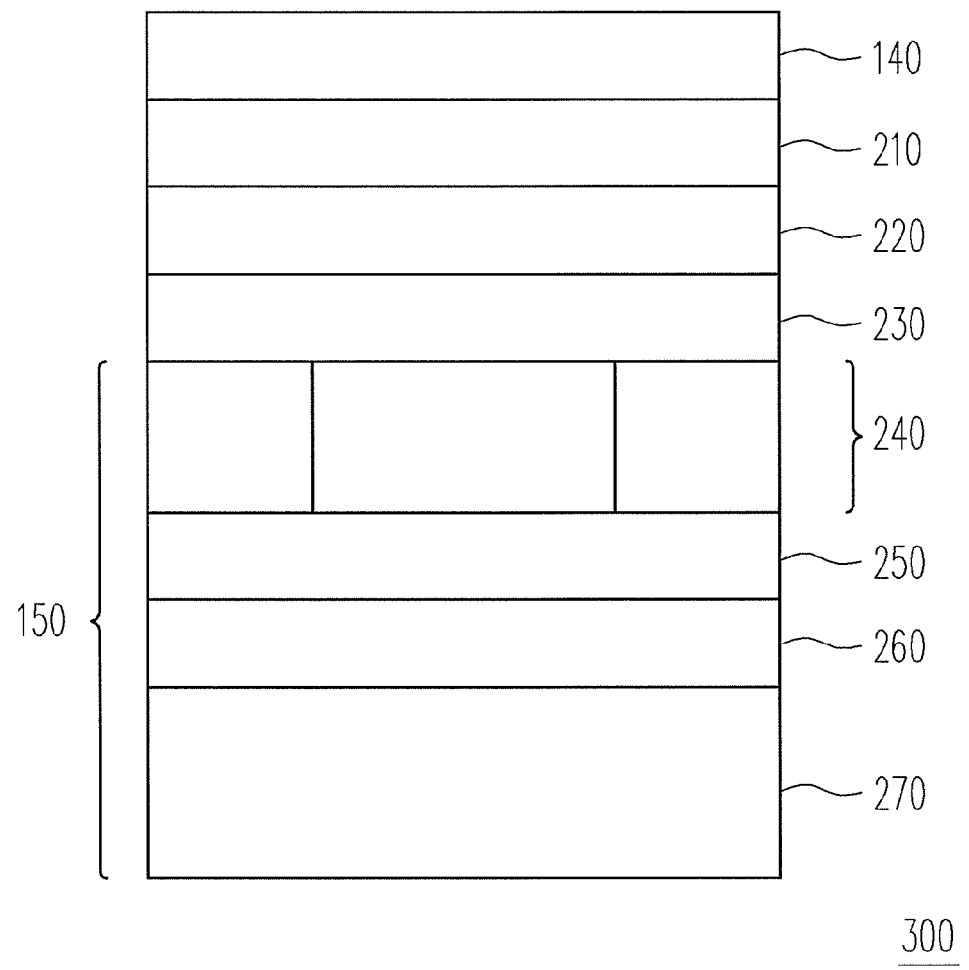

Please refer to FIG. 3, which is a structural diagram of a resistive memory 300 of an embodiment of the present invention. Similar to the resistive memory 200, the resistive memory 300 also has the first solid electrolyte 210, the oxidizable electrode 220 and the second solid electrolyte 230. Moreover, the resistive memory 300 further comprises a composing layer 240, a titanium nitride layer 250, an inter-metal dielectric (IMD) layer 260, and a substrate 270. The composing layer 240 has two silicon oxide ($SiO_2$) spacers 242 and a tungsten (W) layer 244. The tungsten layer 244 is formed between the two silicon oxide spacers 242, and the second solid electrolyte 230 is formed between the oxidizable electrode 220 and the composing layer 240. Additionally, the titanium nitride layer 250 is formed between the composing layer 240 and the IMD layer 260, and the IMD layer 260 is formed between the titanium nitride layer 250 and the substrate 270. In the embodiment, the first biasing layer 140 is an electrode, and the composing layer 240, the titanium nitride layer 250, the IMD layer 260 and the substrate 270 could be regarded as the second biasing layer 150 as shown in FIG. 2.

When the voltage V is applied to the first biasing layer 140 of the resistive memory 300, positive metal ions in the oxidizable electrode 220 are driven to the first solid electrolyte 210 or to the second solid electrolyte 230. In detail, when the voltage V is positive, the positive metal ions in the oxidizable electrode 220 are driven to the second solid electrolyte 230. When the voltage V is negative, the positive metal ions in the oxidizable electrode 220 are driven to the first solid electrolyte 210. Since the positive metal ions in the oxidizable electrode 220 are driven, the resistances of the first solid electrolyte 210 and the second solid electrolyte 230 are changed accordingly. Therefore, the data stored by the first solid electrolyte 210 and the second solid electrolyte 230 could be determined according to the resistances of the first solid electrolyte 210 and the second solid electrolyte 230.

Figure 4A:
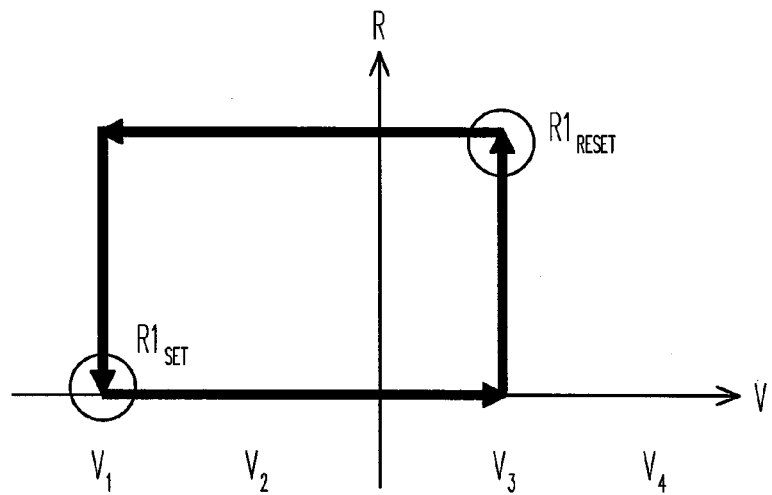
FIG. 4A is a diagram illustrating the relationship of the voltage V and the resistance of the first solid electrolyte of the resistive memory shown in FIG. 3.
Figure 4B:
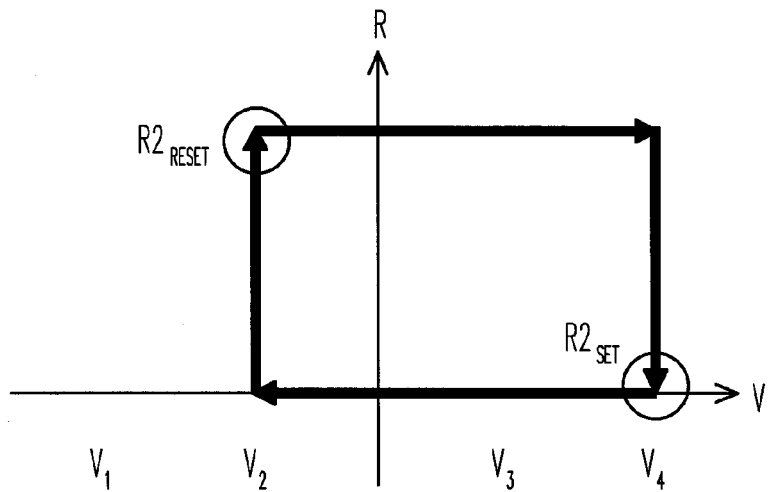
FIG. 4B is a diagram illustrating the relationship of the voltage V and the resistance of the second solid electrolyte of the resistive memory shown in FIG. 3.
Figure 4C:
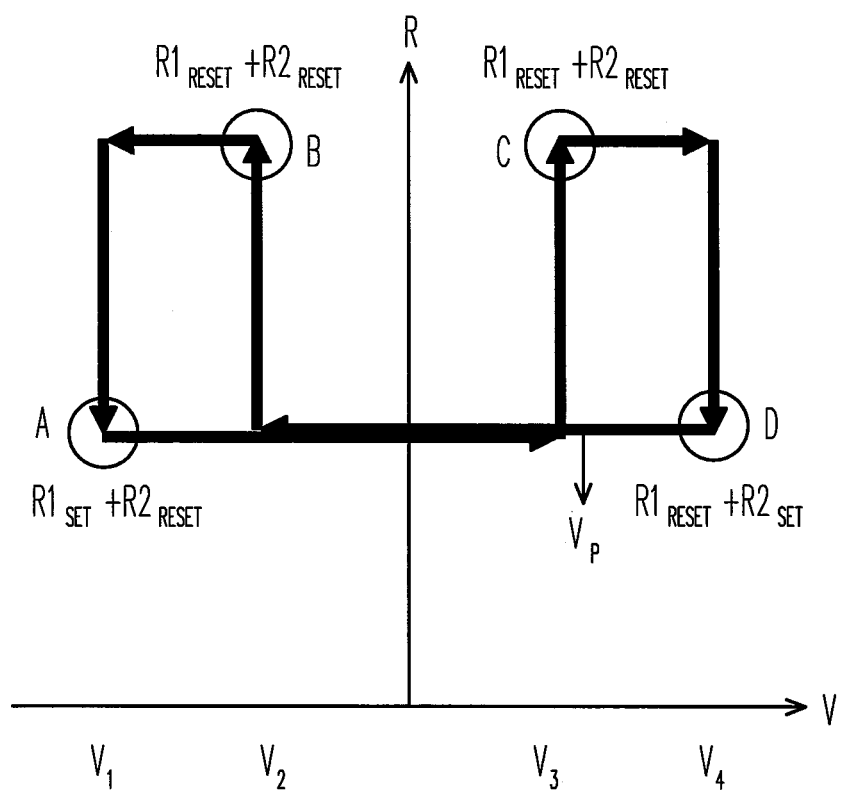
FIG. 4C is a diagram illustrating the relationship of the voltage V and the resistance of the first solid electrolyte and the second solid electrolyte of the resistive memory shown in FIG. 3.

Please refer to FIGS. 3 and 4A-4C. FIG. 4A is a diagram illustrating the relationship of the voltage V and the resistance of the first solid electrolyte 210. FIG. 4B is a diagram illustrating the relationship of the voltage V and the resistance of the second solid electrolyte 230. FIG. 4C is a diagram illustrating the relationship of the voltage V and the resistance of the two solid electrolytes 210 and 230. The horizontal axis represents the value of the voltage V applied to the first biasing layer 140. The vertical axis of FIG. 4A represents the resistance of the first solid electrolyte 210. The vertical axis of FIG. 4B represents the resistance of the second solid electrolyte 230. The vertical axis of FIG. 4C represents the resistance of the first solid electrolyte 210 and the second solid electrolyte 230. As shown in FIG. 4A, when the voltage V is pulled down to a first value $V_1$, the resistance of the first solid electrolyte 210 is changed from $R1_{RESET}$ to $R1_{SET}$. When the voltage is pulled up to a third value $V_3$, the resistance of the first solid electrolyte 210 is changed from $R1_{RESET}$ to $R1_{SET}$. As shown in FIG. 4B, when the voltage V is pulled down to a second value $V_2$, the resistance of the second solid electrolyte 230 is changed from $R2_{RESET}$ to $R2_{SET}$. When the voltage is pulled up to a fourth value $V_4$, the resistance of the second solid electrolyte 230 is changed from $R2_{RESET}$ to $R2_{SET}$. In other words, each of the first solid electrolyte 210 and the second solid electrolyte 230 has two memory states based on the resistances thereof, such that the resistive memory 300 has four memory states. The present memory state of the resistive memory 300 could be determined according to the resistances of the first solid electrolyte 210 and the second solid electrolyte 1230.

FIG. 4C shows the sum of the resistances of the first solid electrolyte 210 and the second solid electrolyte 230 while the value of the voltage V is adjusted. As shown in FIG. 4C, the four memory states of the resistive memory 300 are respectively labeled by the characters A, B, C, and D. The first memory state A corresponds to the first value $V_1$ and the sum of resistances ($R1_{SET}+R2_{RESET}$), the second memory state B corresponds to the second value $V_2$ and the sum of resistances ($R1_{RESET}+R2_{RESET}$), the third memory state C corresponds to the third value $V_3$ and the sum of resistances ($R1_{RESET}+R2_{RESET}$), and the fourth memory state D corresponds to the fourth value $V_4$ and the sum of resistances ($R1_{RESET}+R2_{SET}$). Since the sums of the resistances corresponding to the second and third memory states B and C are identical (i.e. equal to $R1_{RESET}+R2_{RESET}$), it is difficult to distinguish the second memory state B from the third memory state C. However, states B and C are also distinguishable from the state A and the state D according to the present invention.

Figure 5:
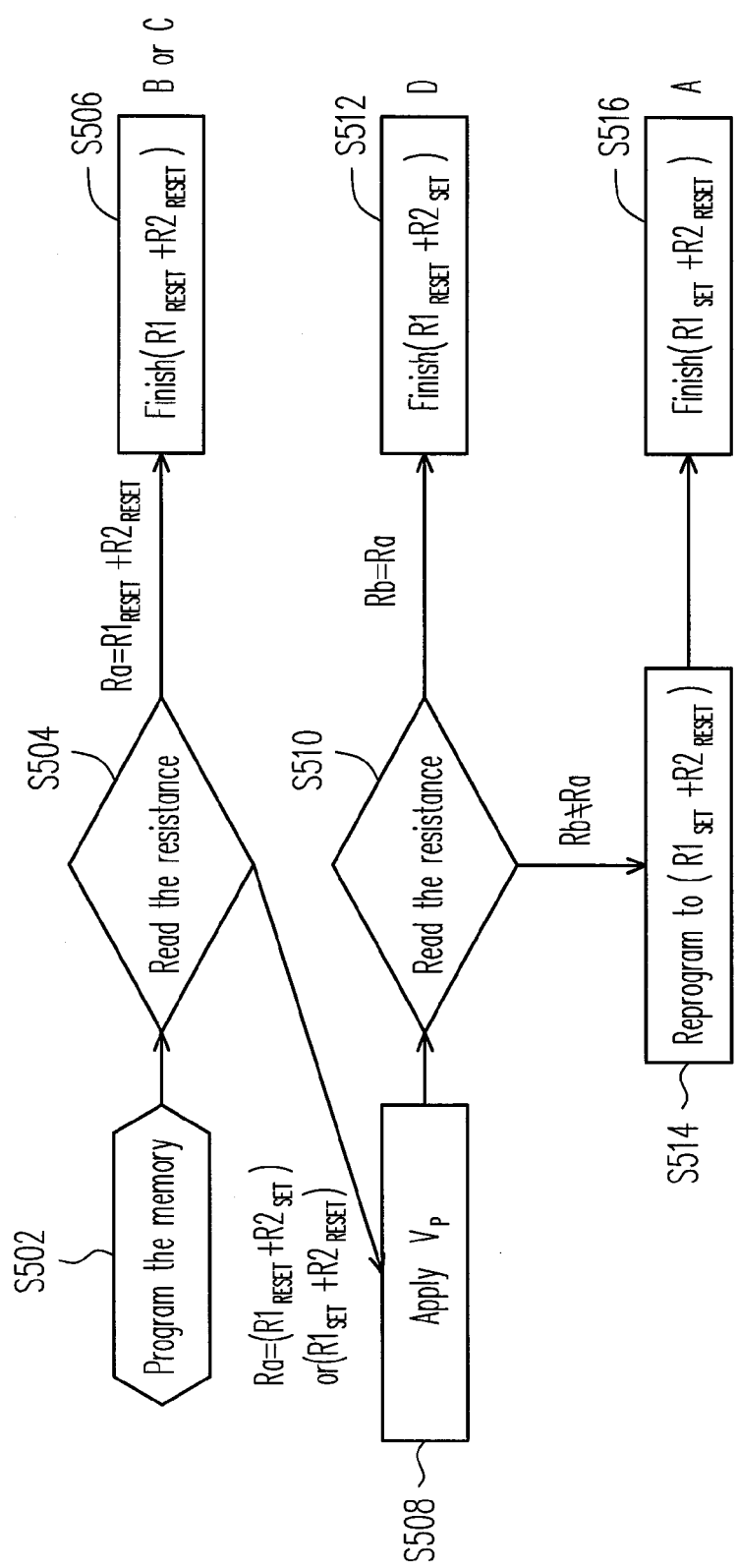
FIG. 5 is a flow chart of a method for controlling the operations of the resistive memory having the relationships illustrated in FIGS. 4A-4C.

Please refer to FIG. 5, which is a flow chart of a method for controlling the operations of the resistive memory 300 having the relationships illustrated in FIGS. 4A-4C. In step S502, the resistive memory 300 is programmed. Then, in step S504, the resistance between the first memory layer 210 and the second memory layer 230 is measured while a first voltage is applied to the first biasing layer 140 so as to determine the present memory state of the resistive memory 300. In the embodiment, the first voltage is greater than the second value $V_2$ but less than the third value $V_3$, such that the memory state of the resistive memory 300 would not changed after the first voltage is applied. The resistance measured in step S504 is regarded as a first resistance Ra, and a predetermined value is equal to ($R1_{RESET}+R2_{RESET}$). If the first resistance Ra is equal to the predetermined value, then it is determined that the state of the resistive memory is a first state (i.e. the memory state B or C) (Step S506). If the first resistance Ra is not equal to the predetermined value, then a second voltage Vp is applied to the first biasing layer 140 (Step S508). In the embodiment, the second voltage Vp is greater than the third value $V_3$ but less than the fourth value $V_4$. In other words, the second voltage Vp is greater than the first voltage. In step S510, the resistance between the first memory layer 210 and the second memory layer 230 is measured again. The resistance measured in step S510 is regarded as a second resistance Rb. If the second resistance Rb is equal to the first resistance Ra, it means that the state of the resistive memory 300 is not changed after the second voltage Vp is applied, such that it could be determined that the state of the resistive memory 300 is a second state (i.e. the memory state D) (Step S512). If the second resistance Rb is not equal to the first resistance Ra, it means that the state of the resistive memory 300 is changed after the second voltage Vp is applied, such that it could be determined that the state of the resistive memory 300 is a third state (i.e. the memory state A) (Step S516). Since the state of the resistive memory 300 may be changed in step S508 if the second resistance Rb is not equal to the first resistance Ra, the resistive memory 300 would be reprogrammed to be the third state (i.e. the memory state A) in step S514.

Figure 6A:
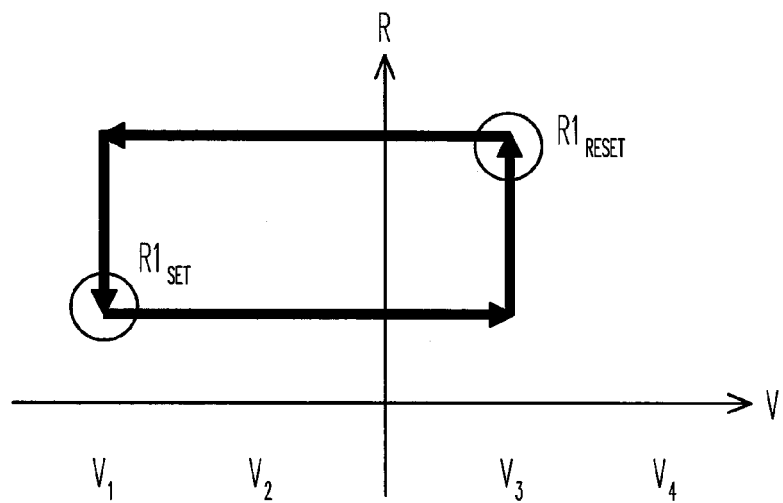
FIG. 6A is a diagram illustrating the relationship of the voltage V and the resistance of the first solid electrolyte in another embodiment of the present invention.
Figure 6B:
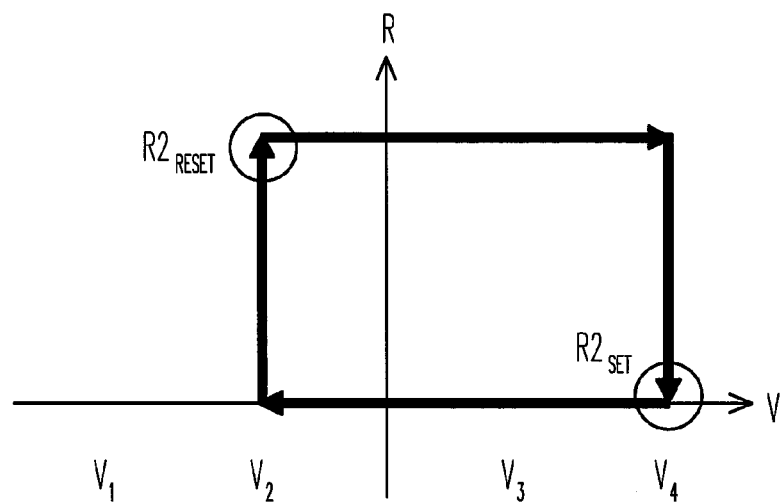
FIG. 6B is a diagram illustrating the relationship of the voltage V and the resistance of the second solid electrolyte in the same embodiment as FIG. 6A.
Figure 6C:
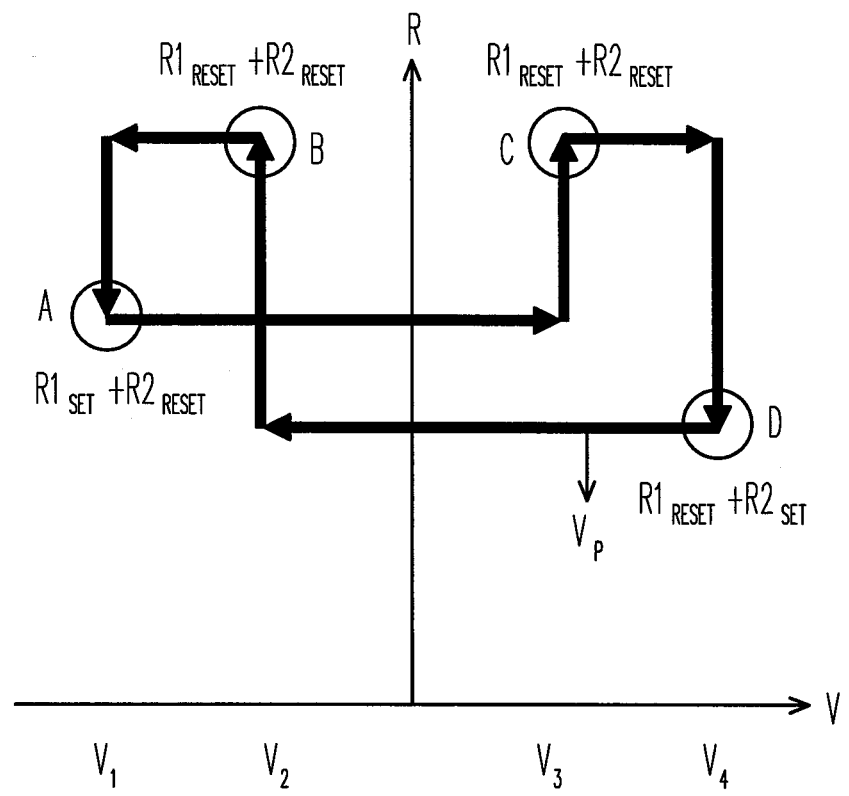
FIG. 6C is a diagram illustrating the relationship of the voltage V and the resistance of the first solid electrolyte and the second solid electrolyte in the same embodiment as FIG. 6A

Please refer to FIGS. 3 and 6A-6C. FIG. 6A is a diagram illustrating the relationship of the voltage V and the resistance of the first solid electrolyte 210 in another embodiment of the present invention. FIG. 6B is a diagram illustrating the relationship of the voltage V and the resistance of the second solid electrolyte 230 in the other embodiment of the present invention. FIG. 6C is a diagram illustrating the relationship of the voltage V and the resistance of the two solid electrolytes 210 and 230 in the other embodiment of the present invention. The horizontal axis represents the value of the voltage V applied to the first biasing layer 140. The vertical axis of FIG. 6A represents the resistance of the first solid electrolyte 210. The vertical axis of FIG. 6B represents the resistance of the second solid electrolyte 230. The vertical axis of FIG. 6C represents the resistance of the first solid electrolyte 210 and the second solid electrolyte 230. In the embodiment, the value of $R1_{SET}$ is greater than that of $R2_{SET}$, and the value of $R1_{RESET}$ is equal to that of $R2_{RESET}$. Therefore, the sum of the resistances ($R1_{RESET}+R2_{RESET}$) corresponding to the memory state B is equal to that corresponding to the memory state C, and the sum of the resistances ($R1_{SET}+R2_{RESET}$) corresponding to the memory state A is different from that ($R1_{RESET}+R2_{SET}$) corresponding to the memory state D. Therefore, in the embodiment, the state of the resistive memory 300 could be determined according to the first resistance Ra directly.

Figure 7:
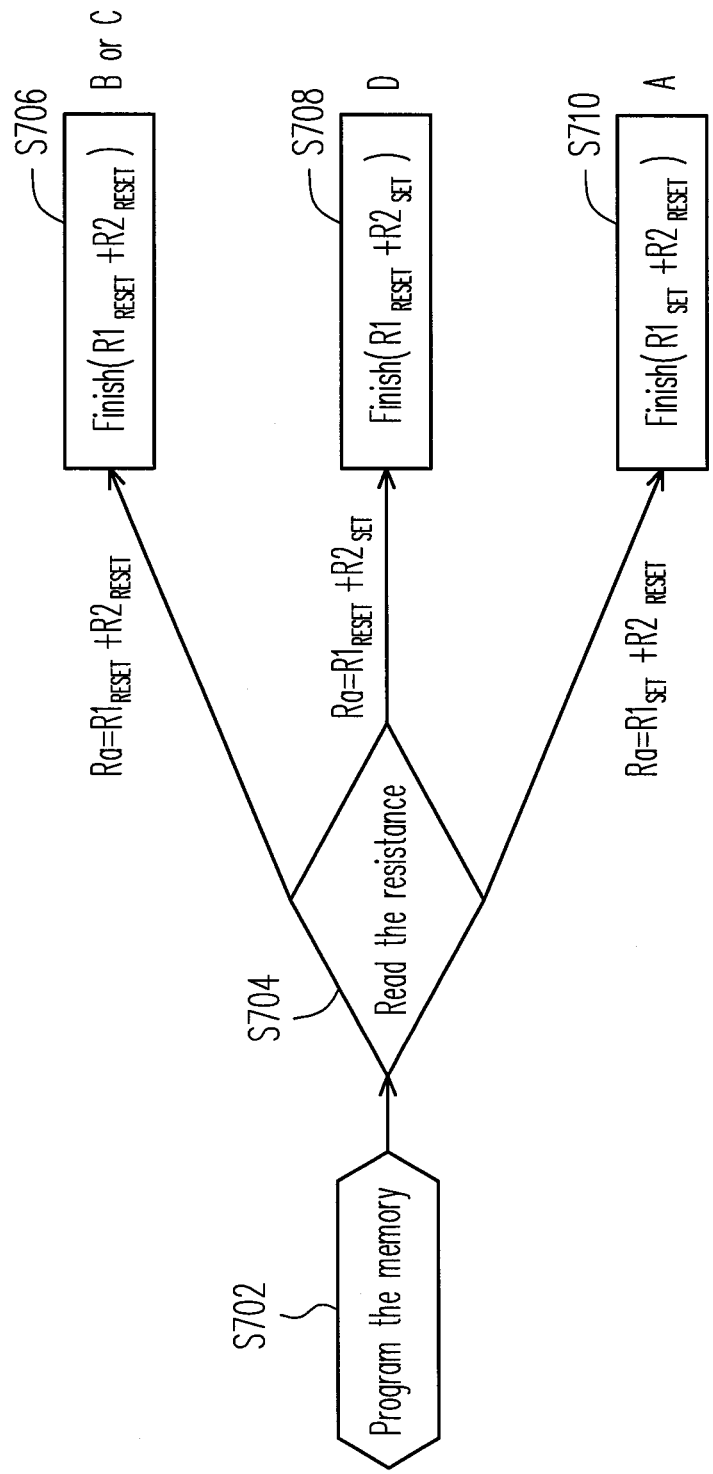
FIG. 7 is a flow chart of a method for controlling the operations of the resistive memory having the relationships illustrated in FIGS. 6A-6C.

Please refer to FIG. 7, which is a flow chart of a method for controlling the operations of the resistive memory 300 having the relationships illustrated in FIGS. 6A-6C. In step S702, the resistive memory 300 is programmed. Then, in step S704, the resistance between the first memory layer 210 and the second memory layer 230 is measured as the first resistance Ra while the first voltage is applied to the first biasing layer 140. If the first resistance Ra is equal to ($R1_{RESET}+R2_{RESET}$), it is determined that the state of the resistive memory 300 is the first state (i.e. the memory state B or C) (Step S706). If the first resistance Ra is equal to ($R1_{RESET}+R2_{SET}$), it is determined that the state of the resistive memory 300 is the second state (i.e. the memory state D) (Step S708). If the first resistance Ra is equal to ($R1_{SET}+R2_{RESET}$), it is determined that the state of the resistive memory 300 is the third state (i.e. the memory state A) (Step S710).

Figure 8A:
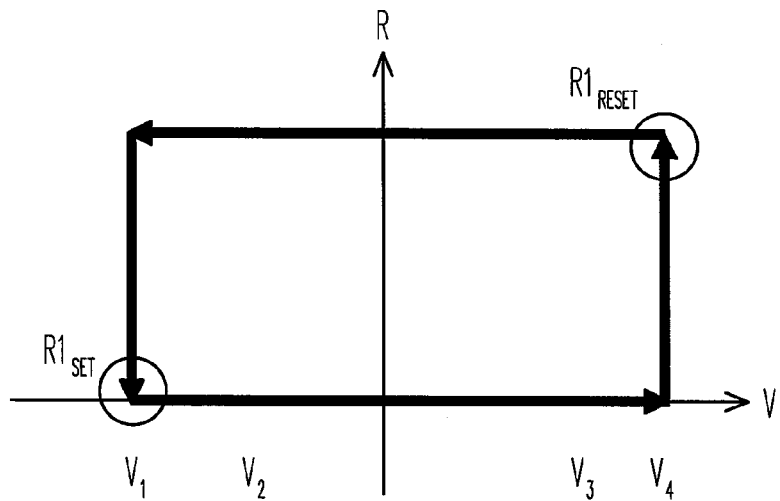
FIG. 8A is a diagram illustrating the relationship of the voltage V and the resistance of the first solid electrolyte in another embodiment of the present invention.
Figure 8B:
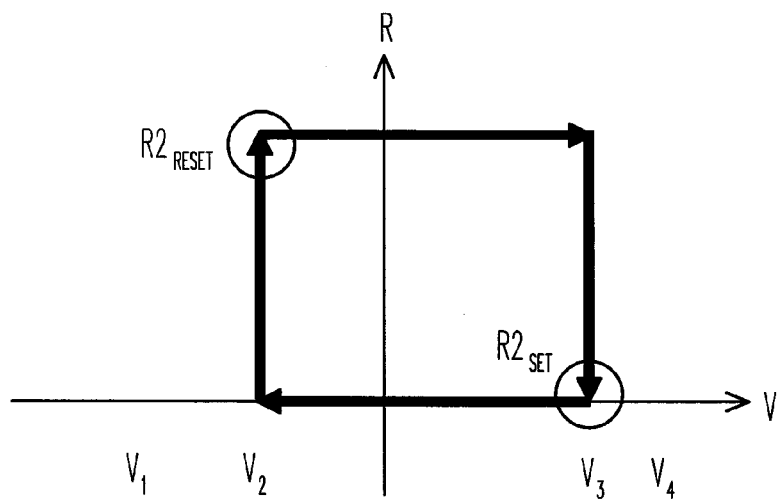
FIG. 8B is a diagram illustrating the relationship of the voltage V and the resistance of the second solid electrolyte in the same embodiment as FIG. 8A.
Figure 8C:
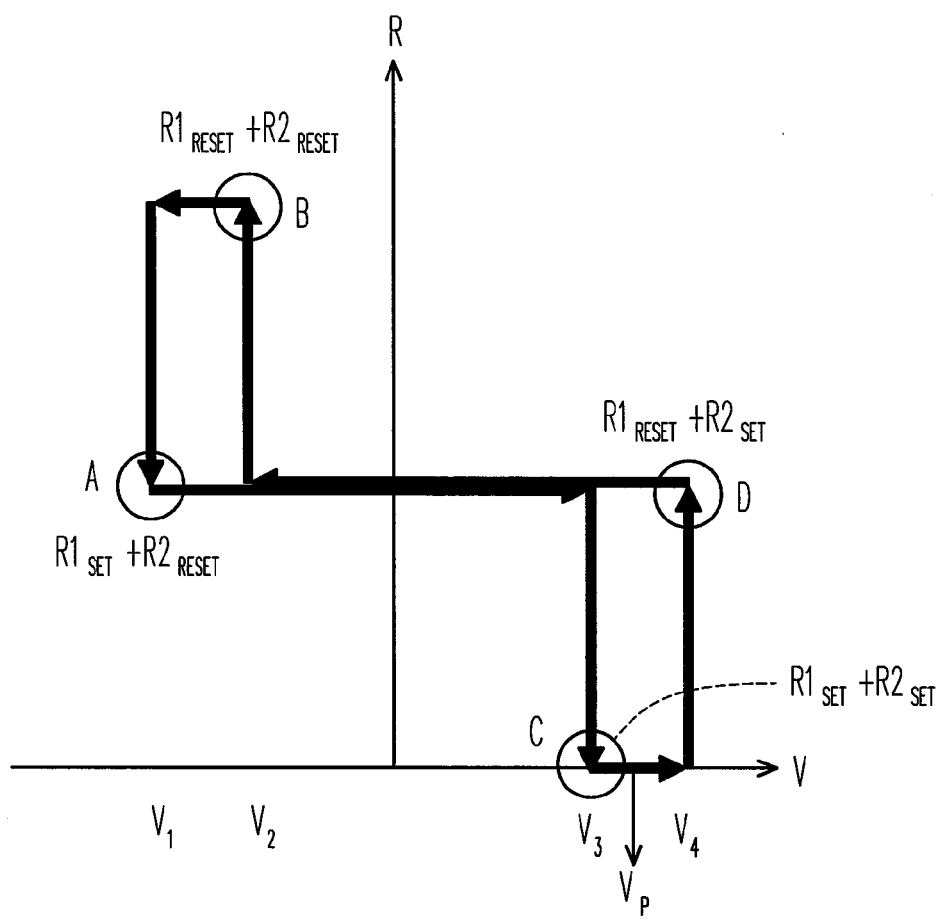
FIG. 8C is a diagram illustrating the relationship of the voltage V and the resistance of the first solid electrolyte and the second solid electrolyte in the same embodiment as FIG. 8A.

Please refer to FIGS. 3 and 8A-8C. FIG. 8A is a diagram illustrating the relationship of the voltage V and the resistance of the first solid electrolyte 210 in another embodiment of the present invention. FIG. 8B is a diagram illustrating the relationship of the voltage V and the resistance of the second solid electrolyte 230 in the same embodiment as FIG. 8A. FIG. 8C is a diagram illustrating the relationship of the voltage V and the resistance of the two solid electrolytes 210 and 230 in the same embodiment as FIG. 8A. The horizontal axis represents the value of the voltage V applied to the first biasing layer 140. The vertical axis of FIG. 8A represents the resistance of the first solid electrolyte 210. The vertical axis of FIG. 8B represents the resistance of the second solid electrolyte 230. The vertical axis of FIG. 8C represents the resistance of the first solid electrolyte 210 and the second solid electrolyte 230. As shown in FIG. 8A, when the voltage V is pulled down to the first value $V_1$, the resistance of the first solid electrolyte 210 is changed from $R1_{RESET}$ to $R1_{SET}$. When the voltage is pulled up to the fourth value $V_4$, the resistance of the first solid electrolyte 210 is changed from $R1_{SET}$ to $R1_{RESET}$. As shown in FIG. 8B, when the voltage V is pulled down to the second value $V_2$, the resistance of the second solid electrolyte 230 is changed from $R2_{SET}$ to $R2_{RESET}$. When the voltage is pulled up to the third value $V_3$, the resistance of the second solid electrolyte 230 is changed from $R2_{RESET}$ to $R2_{SET}$.

FIG. 8C shows the sum of the resistances of the first solid electrolyte 210 and the second solid electrolyte 230 while the value of the voltage V is adjusted. As shown in FIG. 8C, the four memory states of the resistive memory 300 are respectively labeled by the characters A, B, C, and D. The first memory state A corresponds to the first value $V_1$ and the sum of resistances ($R1_{SET}+R2_{RESET}$), the second memory state B corresponds to the second value $V_2$ and the sum of resistances ($R1_{RESET}+R2_{RESET}$), the third memory state C corresponds to the third value $V_3$ and the sum of resistances ($R1_{SET}+R2_{SET}$), and the fourth memory state D corresponds to the fourth value $V_4$ and the sum of resistances ($R1_{RESET}+R2_{SET}$).

Figure 9:
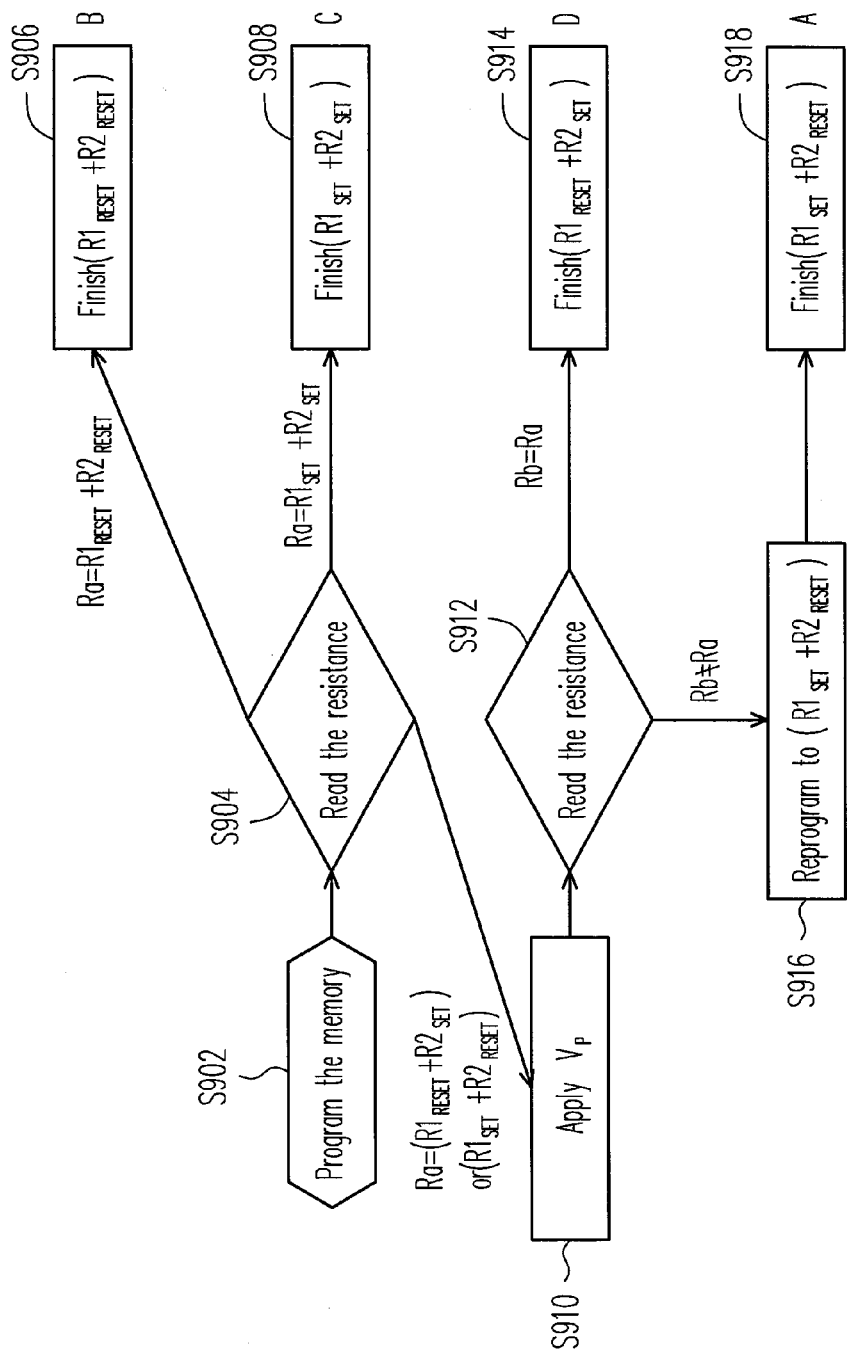
FIG. 9 is a flow chart of a method for controlling the operations of the resistive memory having the relationships illustrated in FIGS. 8A-8C.

Please refer to FIG. 9, which is a flow chart of a method for controlling the operations of the resistive memory 300 having the relationships illustrated in FIGS. 8A-8C. In step S902, the resistive memory 300 is programmed. Then, in step S904, the resistance between the first memory layer 210 and the second memory layer 230 is measured as the first resistance Ra while the first voltage is applied to the first biasing layer 140. In the embodiment, a predetermined value is equal to ($R1_{RESET}+R2_{RESET}$) or ($R1_{SET}+R2_{SET}$). If the first resistance Ra is equal to ($R1_{RESET}+R2_{RESET}$), then it is determined that the state of the resistive memory is a first state (i.e. the memory state B) (Step S906). If the first resistance Ra is equal to ($R1_{SET}+R2_{SET}$), then it is determined that the state of the resistive memory is a second state (i.e. the memory state C) (Step S908). If the first resistance Ra is not equal to ($R1_{RESET}+R2_{RESET}$) nor ($R1_{SET}+R2_{SET}$), then the second voltage Vp is applied to the first biasing layer 140 (Step S910). In step S912, the resistance between the first memory layer 210 and the second memory layer 230 is measured as the second resistance Rb. If the second resistance Rb is equal to the first resistance Ra, it means that the state of the resistive memory 300 is not changed after the second voltage Vp is applied, such that it could be determined that the state of the resistive memory 300 is a third state (i.e. the memory state D) (Step S914). If the second resistance Rb is not equal to the first resistance Ra, it means that the state of the resistive memory 300 has been changed after the second voltage Vp is applied, such that it could be determined that the state of the resistive memory 300 is a fourth state (i.e. the memory state A) (Step S918). Since the state of the resistive memory 300 may be changed in step S910 if the second resistance Rb is not equal to the first resistance Ra, the resistive memory 300 would be reprogrammed to be the fourth state (i.e. the memory state A) in step S916.

Figure 10A:
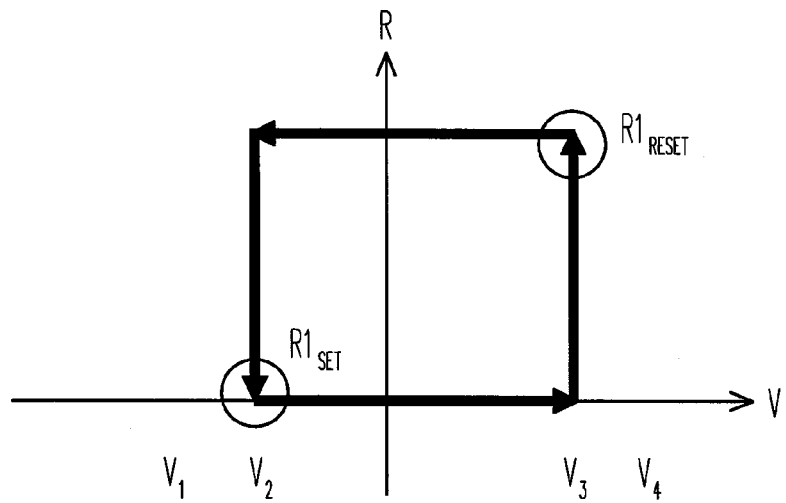
FIG. 10A is a diagram illustrating the relationship of the voltage V and the resistance of the first solid electrolyte in another embodiment of the present invention.
Figure 10B:
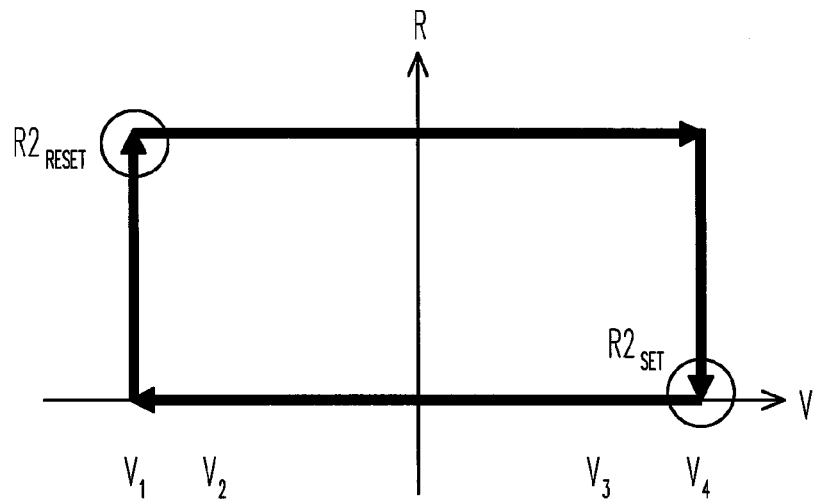
FIG. 10B is a diagram illustrating the relationship of the voltage V and the resistance of the second solid electrolyte in the same embodiment as FIG. 10A.
Figure 10C:
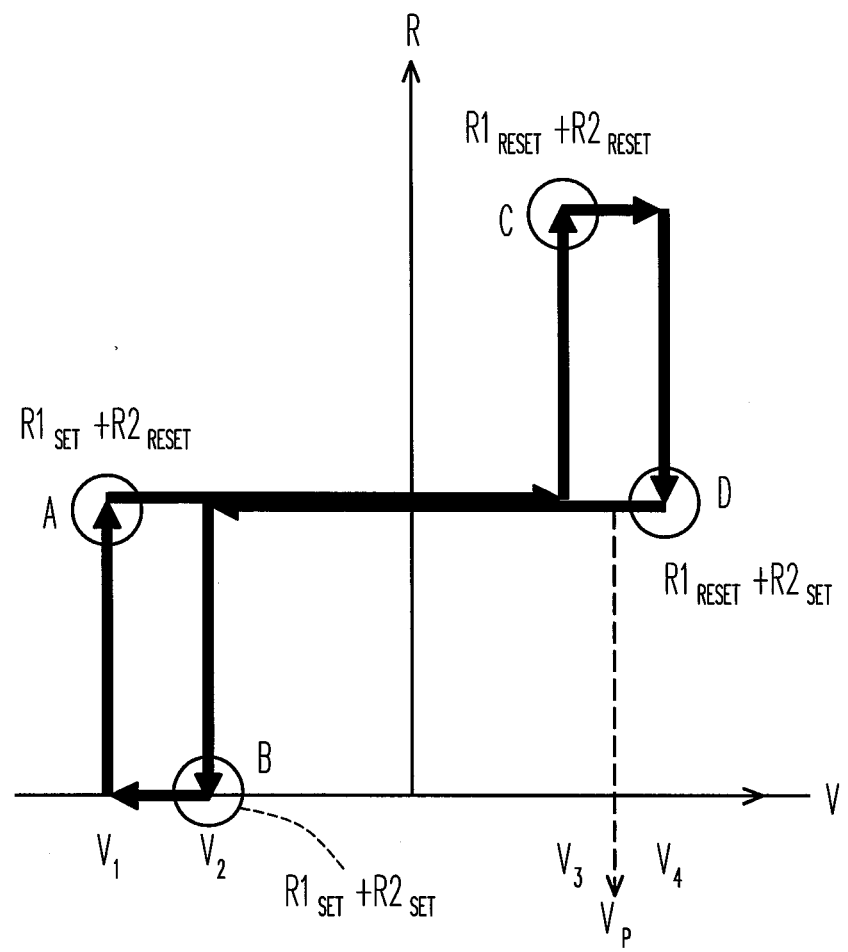
FIG. 10C is a diagram illustrating the relationship of the voltage V and the resistance of the first solid electrolyte and the second solid electrolyte in the same embodiment as FIG. 10A.

Please refer to FIGS. 3 and 10A-10C. FIG. 10A is a diagram illustrating the relationship of the voltage V and the resistance of the first solid electrolyte 210 in another embodiment of the present invention. FIG. 10B is a diagram illustrating the relationship of the voltage V and the resistance of the second solid electrolyte 230 in the same embodiment as FIG. 10A. FIG. 10C is a diagram illustrating the relationship of the voltage V and the resistance of the two solid electrolytes 210 and 230 in the same embodiment as FIG. 10A. The horizontal axis represents the value of the voltage V applied to the first biasing layer 140. The vertical axis of FIG. 10A represents the resistance of the first solid electrolyte 210. The vertical axis of FIG. 10B represents the resistance of the second solid electrolyte 230. The vertical axis of FIG. 10C represents the resistance of the first solid electrolyte 210 and the second solid electrolyte 230. As shown in FIG. 10A, when the voltage V is pulled down to the second value $V_2$, the resistance of the first solid electrolyte 210 is changed from $R1_{RESET}$ to $R1_{SET}$. When the voltage is pulled up to the third value $V_3$, the resistance of the first solid electrolyte 210 is changed from $R1_{SET}$ to $R1_{RESET}$. As shown in FIG. 10B, when the voltage V is pulled down to the first value $V_1$, the resistance of the second solid electrolyte 230 is changed from $R2_{SET}$ to $R2_{RESET}$. When the voltage is pulled up to the fourth value $V_4$, the resistance of the second solid electrolyte 230 is changed from $R2_{RESET}$ to $R2_{SET}$.

FIG. 10C shows the sum of the resistances of the first solid electrolyte 210 and the second solid electrolyte 230 while the value of the voltage V is adjusted. As shown in FIG. 10C, the four memory states of the resistive memory 300 are respectively labeled by the characters A, B, C, and D. The first memory state A corresponds to the first value $V_1$ and the sum of resistances ($R1_{SET}+R2_{RESET}$), the second memory state B corresponds to the second value $V_2$ and the sum of resistances ($R1_{SET}+R2_{SET}$), the third memory state C corresponds to the third value $V_3$ and the sum of resistances ($R1_{RESET}+R2_{RESET}$), and the fourth memory state D corresponds to the fourth value $V_4$ and the sum of resistances ($R1_{RESET}+R2_{SET}$).

Figure 11:
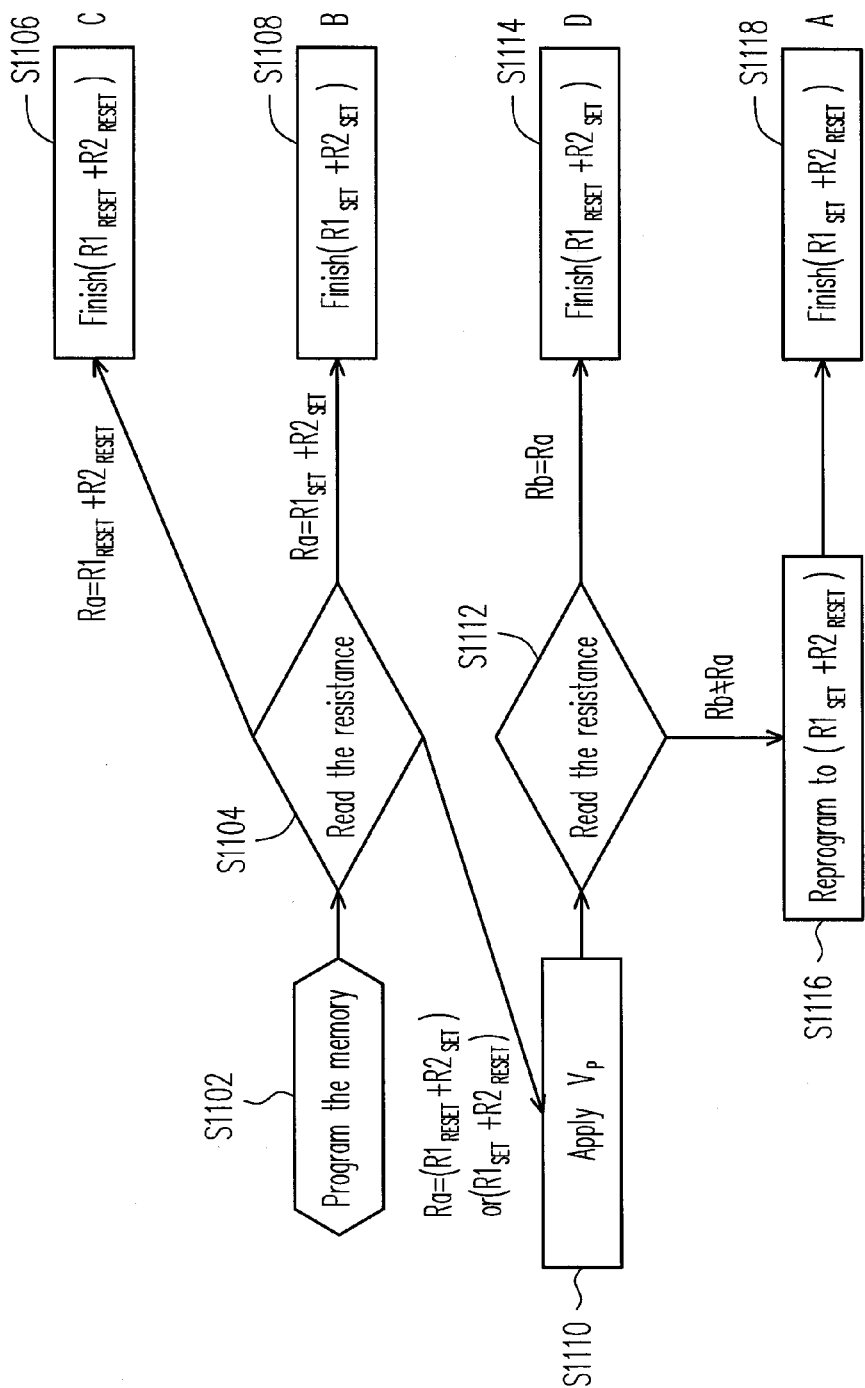
FIG. 11 is a flow chart of a method for controlling the operations of the resistive memory having the relationships illustrated in FIGS. 10A-10C.

Please refer to FIG. 11, which is a flow chart of a method for controlling the operations of the resistive memory 300 having the relationships illustrated in FIGS. 10A-10C. In step S1102, the resistive memory 300 is programmed. Then, in step S1104, the resistance between the first memory layer 210 and the second memory layer 230 is measured as the first resistance Ra while the first voltage is applied to the first biasing layer 140. In the embodiment, a predetermined value is equal to ($R1_{RESET}+R2_{RESET}$) or ($R1_{SET}+R2_{SET}$). If the first resistance Ra is equal to ($R1_{RESET}+R2_{RESET}$), then it is determined that the state of the resistive memory is a first state (i.e. the memory state C) (Step S1106). If the first resistance Ra is equal to ($R1_{SET}+R2_{SET}$), then it is determined that the state of the resistive memory is a second state (i.e. the memory state B) (Step S1108). If the first resistance Ra is not equal to ($R1_{RESET}+R2_{RESET}$) nor ($R1_{SET}+R2_{SET}$), then the second voltage Vp is applied to the first biasing layer 140 (Step S1110). In step S1112, the resistance between the first memory layer 210 and the second memory layer 230 is measured as the second resistance Rb. If the second resistance Rb is equal to the first resistance Ra, it means that the state of the resistive memory 300 is not changed after the second voltage Vp is applied, such that it could be determined that the state of the resistive memory 300 is a third state (i.e. the memory state D) (Step S1114). If the second resistance Rb is not equal to the first resistance Ra, it means that the state of the resistive memory 300 has been changed after the second voltage Vp is applied, such that it could be determined that the state of the resistive memory 300 is a fourth state (i.e. the memory state A) (Step S1118). Since the state of the resistive memory 300 may be changed in step S910 if the second resistance Rb is not equal to the first resistance Ra, the resistive memory 300 would be reprogrammed to be the fourth state (i.e. the memory state A) in step S1116.

Figure 12:
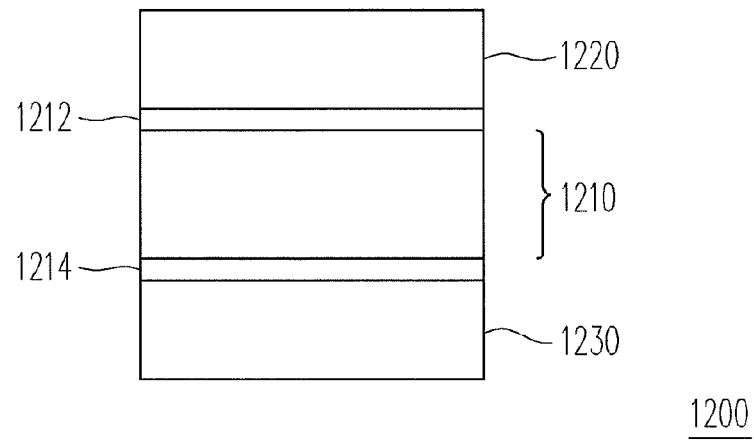
FIGS. 12-13 are structural diagrams of the resistive memories according to the embodiments of the present invention.

Please refer to FIG. 12, which is a structural diagram of a resistive memory 1200 of an embodiment of the present invention. The resistive memory 1200 has a medium layer 1210, a first barrier layer 1220, and a second barrier layer 1230. The interface 1212 between the medium layer 1210 and the first barrier layer 1220 is regarded as the first memory layer of the resistive memory 1200, and the interface 1214 between the medium layer 1210 and the second barrier layer 1230 is regarded as the second memory layer of the resistive memory 1200. The data stored by the resistive memory 1200 could be determined according to the resistances of the first memory layer 1212 and the second memory layer 1214. In the embodiment, the first barrier layer 1220 and the second barrier layer 1230 are made of a material selected from a group consisting of titanium nitride (TiN), tantalum nitride (TaN), platinum (Pt), and gold (Au), and the medium layer 1210 is a metal oxide layer which is made of a material selected from a group consisting of tungsten oxide, titanium oxide, nickel oxide, aluminum oxide, cupric oxide, zirconium oxide, niobium oxide, and tantalum oxide.

Figure 13:
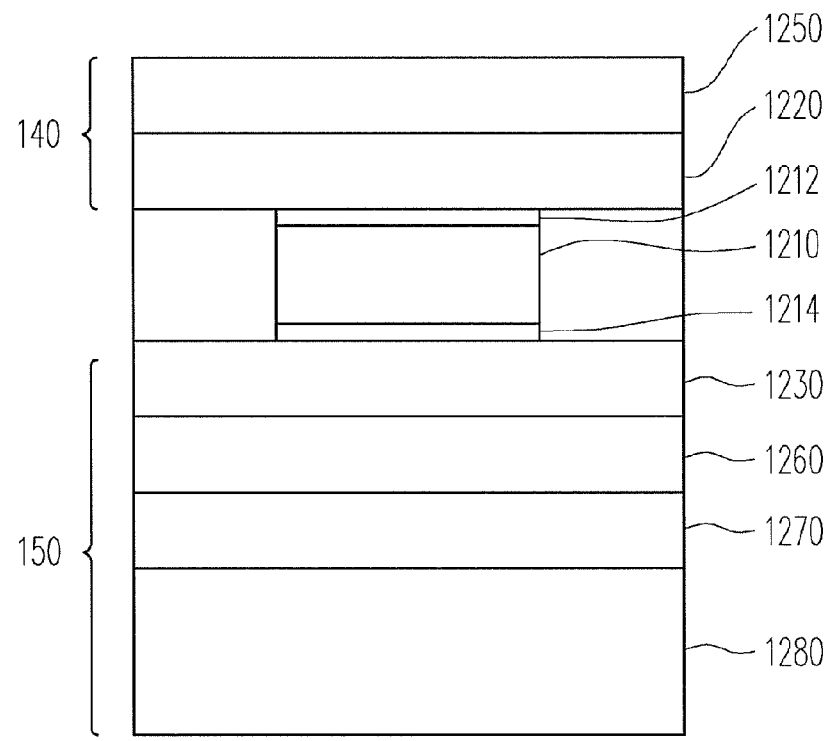

Please refer to FIG. 13, which is a structural diagram of a resistive memory 1300 of an embodiment of the present invention. The resistive memory 1300 also has the metal oxide layer 1210, the first barrier layer 1220, and the second barrier layer 1230. Moreover, the resistive memory 1300 further comprises two silicon oxide spacers 1240, a first electrode 1250, a second electrode 1260, an inter-metal dielectric (IMD) layer 1270, and a substrate 1280. The two silicon oxide spacers 1240 are contacted with the metal oxide layer 1210 and formed between the first barrier layer 1220 and the second barrier layer 1230. The first electrode 1250 is formed on the first barrier layer 1220, and the second electrode 1260 is formed between the second barrier layer 1230 and the IID layer 1270. The IMD layer 1270 is formed between the second electrode 1260 and the substrate 1280. In the embodiment, the first electrode 1250 and the first barrier layer 1220 are regarded as the first biasing layer 140 of the resistive memory 1300, and the second barrier layer 1230, the second electrode 1260, the IMD layer 1270, and the substrate 1280 are regarded as the second biasing layer 150 of the resistive memory 1300.

Figure 14A:
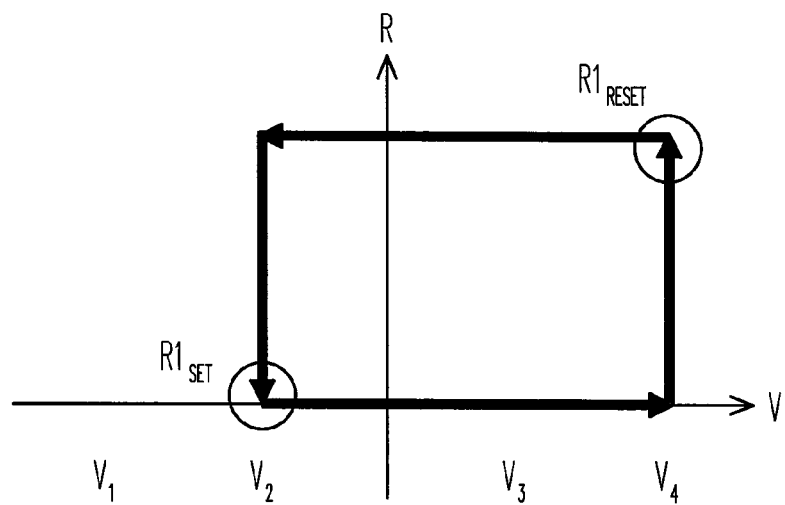
FIG. 14A is a diagram illustrating the relationship of the voltage V and the resistance of the first interface according to an embodiment of the present invention.
Figure 14B:
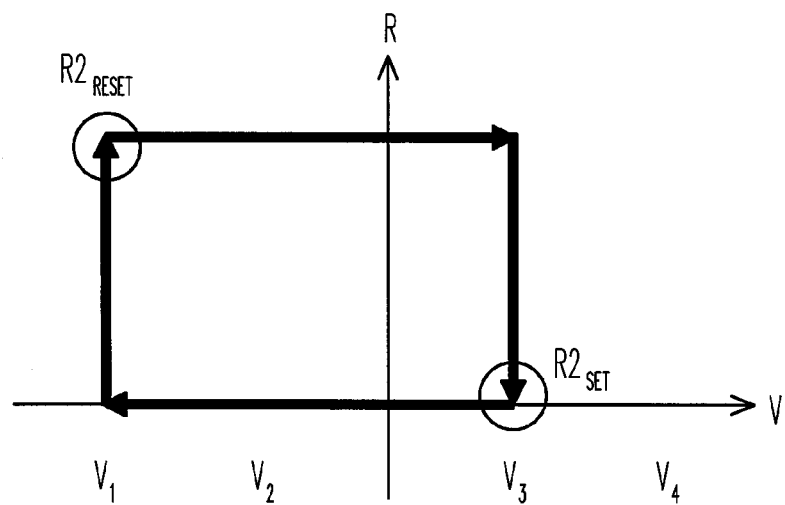
FIG. 14B is a diagram illustrating the relationship of the voltage V and the resistance of the second interface in the same embodiment as FIG. 14A.
Figure 14C:
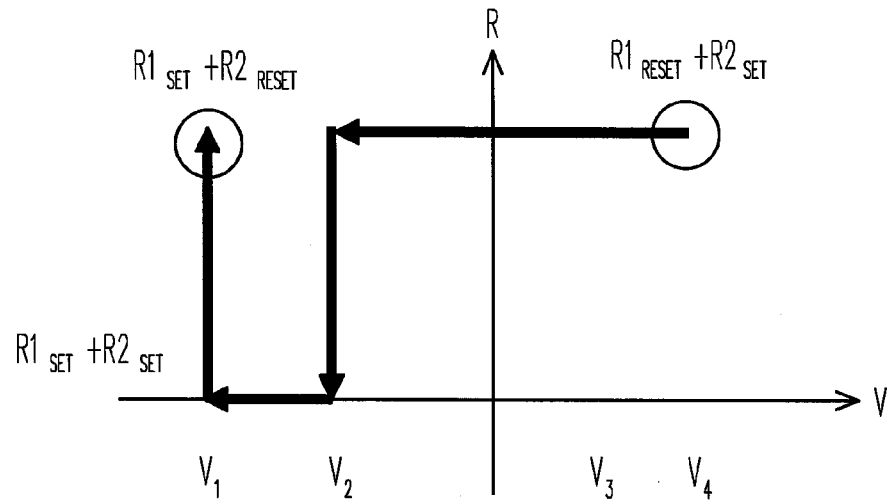
FIG. 14C is a diagram illustrating the relationship of the voltage V and the resistance between the first interface and the second interface when the voltage V is pulled down from a fourth value $V_4$ to a first value $V_1$ in the same embodiment as FIG. 14A.
Figure 14D:
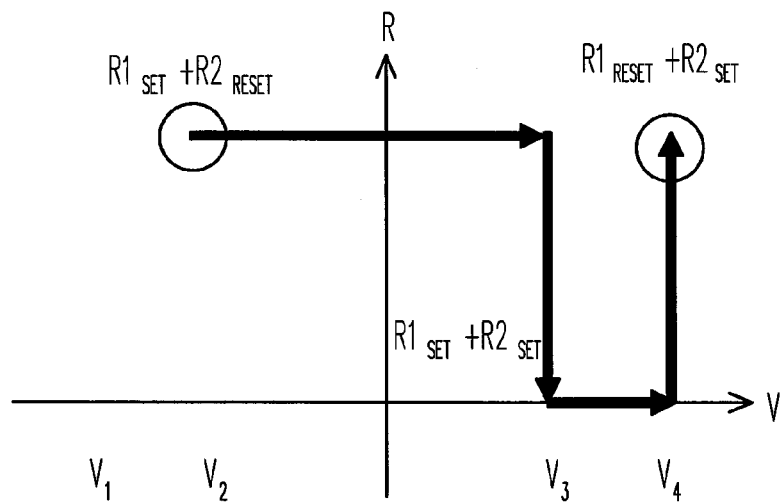
FIG. 14D is a diagram illustrating the relationship of the voltage V and the resistance between the first interface and the second interface when the voltage V is pulled up from a first value $V_1$ to a fourth value $V_4$ in the same embodiment as FIG. 14A.
Figure 14E:
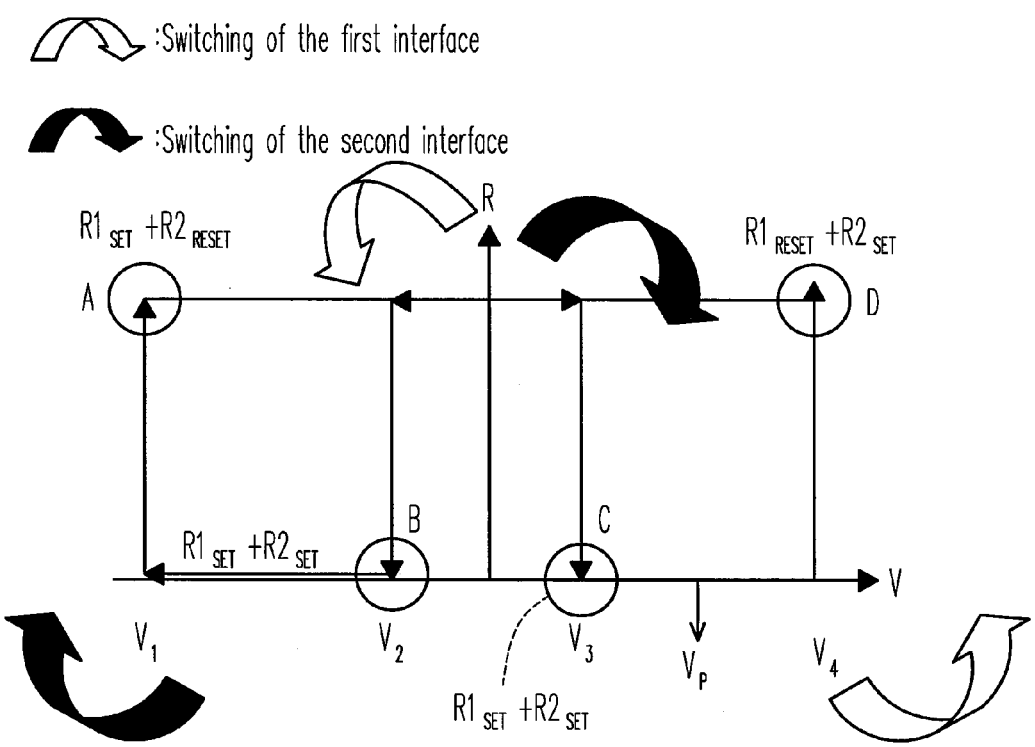
FIG. 14E is a diagram illustrating the switching of memory states of the resistive memory in the same embodiment as FIG. 14A.

When the voltage V is applied to the first biasing layer 140 of the resistive memory 1300, the resistances of the first interface 1212 and the second interface 1214 may be changed accordingly. Please refer to FIG. 13 and FIGS. 14A-14E. FIG. 14A is a diagram illustrating the relationship of the voltage V and the resistance of the first interface 1212. FIG. 14B is a diagram illustrating the relationship of the voltage V and the resistance of the second interface 1214. FIG. 14C is a diagram illustrating the relationship of the voltage V and the resistance between the first interface 1212 and the second interface 1214 when the voltage V is pulled down from the fourth value $V_4$ to the first value $V_1$. FIG. 14D is a diagram illustrating the relationship of the voltage V and the resistance between the first interface 1212 and the second interface 1214 when the voltage V is pulled up from the first value $V_1$ to the fourth value $V_4$. FIG. 14E is a diagram illustrating the switching of memory states of the resistive memory 1300. The horizontal axis represents the value of the voltage V applied to the first biasing layer 140. The vertical axis of FIG. 14A represents the resistance of the first interface 1212. The vertical axis of FIG. 14B represents the resistance of the second interface 1214. The vertical axis of FIGS. 14C-14E represents the resistance between the first interface 1212 and the second interface 1214. As shown in FIG. 14A, when the voltage V is pulled down to the second value $V_2$, the resistance of the first interface 1212 is changed from $R1_{RESET}$ to $R1_{SET}$. When the voltage is pulled up to the fourth value $V_4$, the resistance of the first interface 1212 is changed from $R1_{SET}$ to $R1_{RESET}$. As shown in FIG. 14B, when the voltage V is pulled down to the first value $V_1$, the resistance of the second interface 1215 is changed from $R2_{SET}$ to $R2_{RESET}$. When the voltage is pulled up to the third value $V_3$, the resistance of the second interface 1214 is changed from $R2_{RESET}$ to $R2_{SET}$. In other words, each of the first interface 1212 and the second interface 1214 has two memory states based on the resistances thereof, such that the resistive memory 1300 has four memory states. The present memory state of the resistive memory 1300 could be determined according to the resistances of the first interface 1212 and the second interface 1214.

FIGS. 14C and 14E show the sum of the resistances of the first interface 1212 and the second interface 1214 while the value of the voltage V is pulled down. During the process when the voltage V is pulled down from the fourth $V_4$ to the first voltage $V_1$, the resistance between first interface 1212 and the second interface 1214 is changed from ($R1_{RESET}$+$R2_{SET}$) to ($R1_{SET}$+$R2_{SET}$) and then to ($R1_{SET}$+$R2_{RESET}$). FIGS. 14D and 14E show the sum of the resistances of the first interface 1212 and the second interface 1214 while the value of the voltage V is pulled up. During the process when the voltage V is pulled up from the first voltage $V_1$ to the fourth $V_4$, the resistance between first interface 1212 and the second interface 1214 is changed from ($R1_{SET}$+$R2_{RESET}$) to ($R1_{SET}$+$R2_{SET}$) and then to ($R1_{RESET}$+$R2_{SET}$ As shown in FIG. 14E, the four memory states of the resistive memory 1300 are respectively labeled by the characters A, B, C, and D. The first memory state A corresponds to the first value $V_i$ and the sum of resistances ($R1_{SET}$+$R2_{RESET}$), the second memory state B corresponds to the second value $V_2$ and the sum of resistances ($R1_{SET}$+$R2_{SET}$), the third memory state C corresponds to the third value $V_3$ and the sum of resistances (R1SET+R2SET), and the fourth memory state D corresponds to the fourth value $V_4$ and the sum of resistances ($R1_{RESET}$+$R2_{SET}$). Since the sums of the resistances corresponding to the second and third memory states B and C are identical (i.e. equal to $R1_{SET}$+$R2_{SET}$), it is difficult to distinguish the second memory state B from the third memory state C. However, states B and C are also distinguishable from the state A and the state D according to the present invention.

Figure 15:
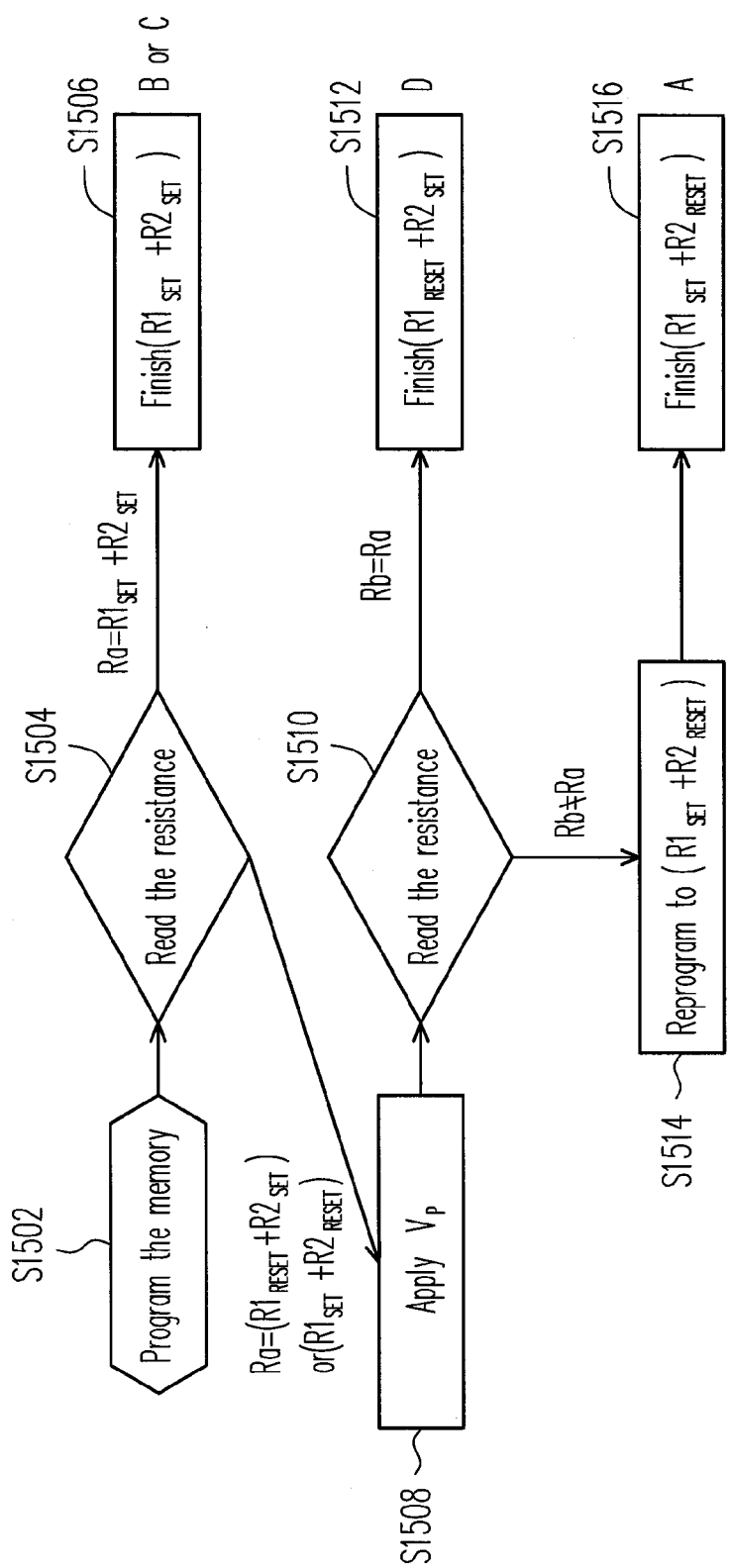
FIG. 15 is a flow chart of a method for controlling the operations of the resistive memory having the relationships illustrated in FIGS. 14A-14E.

Please refer to FIG. 15, which is a flow chart of a method for controlling the operations of the resistive memory 1300 having the relationships illustrated in FIGS. 14A-14E. In step S1502, the resistive memory 1300 is programmed. Then, in step S1504, the resistance between the first interface 1212 and the second memory layer 1214 is measured while the first voltage is applied to the first biasing layer 140. In the embodiment, the first voltage is greater than the second value $V_2$ but less than the third value $V_3$, such that the memory state of the resistive memory 1300 would not changed after the first voltage is applied to the first biasing layer 140. The resistance measured in step S1504 is regarded as a first resistance Ra, and a predetermined value is equal to ($R1_{SET}$+$R2_{SET}$). If the first resistance Ra is equal to the predetermined value, then it is determined that the state of the resistive memory is a first state (i.e. the memory state B or C) (Step S1506). If the first resistance Ra is not equal to the predetermined value, then a second voltage Vp is applied to the first biasing layer 140 (Step S1508). In the embodiment, the second voltage Vp is greater than the third value $V_3$ but less than the fourth value $V_4$. In step S1510, the resistance between the first interface 1212 and the second interface 1214 is measured again. The resistance measured in step S1510 is regarded as a second resistance Rb. If the second resistance Rb is equal to the first resistance Ra, it means that the state of the resistive memory 1300 is not changed after the second voltage Vp is applied, such that it could be determined that the state of the resistive memory 1300 is a second state (i.e. the memory state D) (Step S1512). If the second resistance Rb is not equal to the first resistance Ra, it means that the state of the resistive memory 1300 is changed after the second voltage Vp is applied, such that it could be determined that the state of the resistive memory 1300 is a third state (i.e. the memory state A) (Step S1516). Since the state of the resistive memory 1300 may be changed in step S1508 if the second resistance Rb is not equal to the first resistance Ra, the resistive memory 1300 would be reprogrammed to be the third state (i.e. the memory state A) in step S1514.

Figure 16:
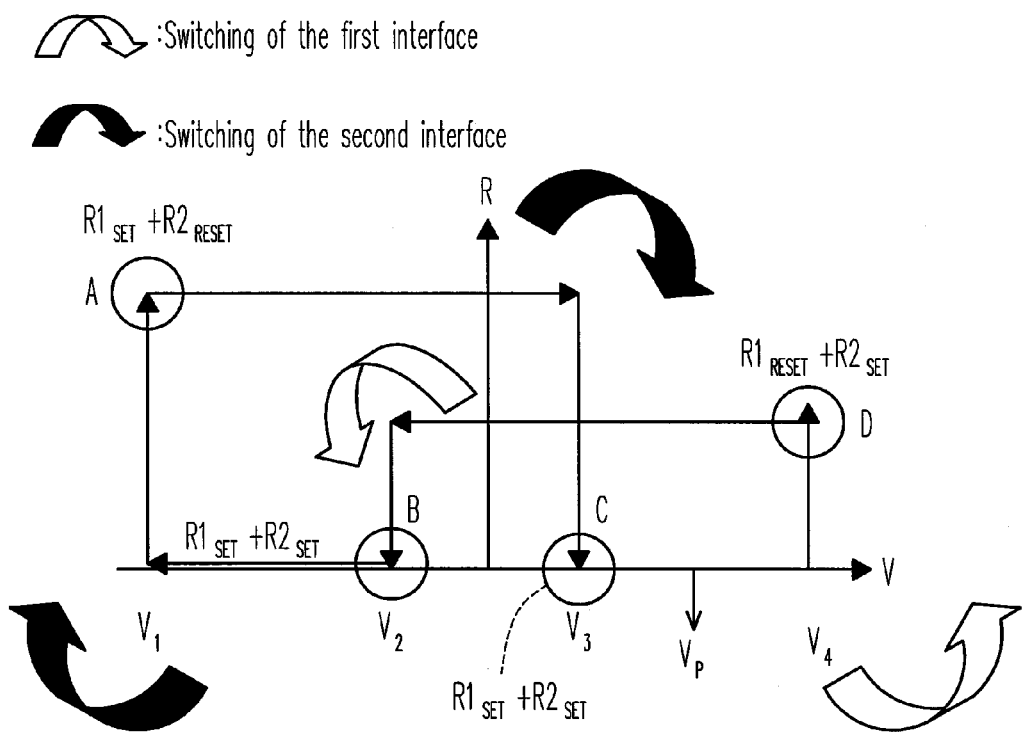
FIG. 16 is a diagram illustrating the switching of memory states of the resistive memory according to an embodiment of the present invention.

Please refer to FIGS. 13 and 16. FIG. 16 is a diagram illustrating the switching of memory states of the resistive memory 1300 according to an embodiment of the present invention. The horizontal axis represents the value of the voltage V applied to the first biasing layer 140, and the vertical axis represents resistance between the first interface 1212 and the second interface 1214. In the embodiment, the value of $_{R1RESET}$ is less than that of $R2_{RESET}$, and the value of $R1_{SET}$ is equal to that of $R2_{SET}$. Therefore, the sum of the resistances ($R1_{SET}$+$R2_{SET}$) corresponding to the memory state B is equal to that corresponding to the memory state C, and the sum of the resistances ($R1_{SET}$+$R2_{SET}$) corresponding to the memory state A is different from that ($R1_{RESET}$+$R2_{SET}$) corresponding to the memory state D. Therefore, in the embodiment, the state of the resistive memory 11300 could be determined according to the first resistance Ra directly.

Figure 17:
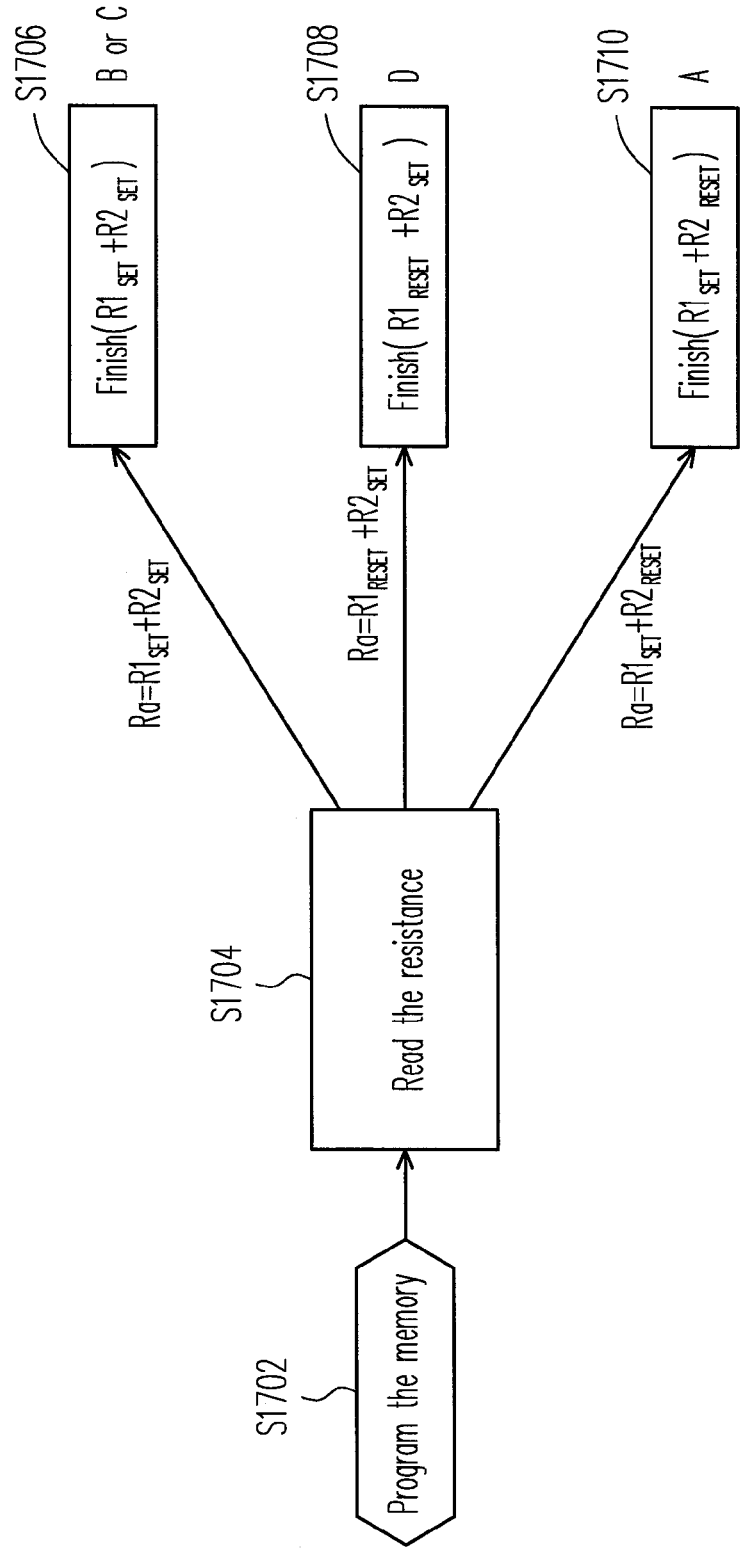
FIG. 17 is a flow chart of a method for controlling the operations of the resistive memory having the relationships illustrated in FIG. 16.

Please refer to FIG. 17, which is a flow chart of a method for controlling the operations of the resistive memory 1300 having the relationships illustrated in FIG. 16. In step S1702, the resistive memory 1300 is programmed. Then, in step S1704, the resistance between the first interface 1212 and the second interface 1214 is measured as the first resistance Ra while the first voltage is applied to the first biasing layer 140. If the first resistance Ra is equal to ($R1_{SET}$+$R2_{SET}$), it is determined that the state of the resistive memory 1300 is the first state (i.e. the memory state B or C) (Step S1706). If the first resistance Ra is equal to ($R1_{RESET}$+$R2_{SET}$), it is determined that the state of the resistive memory 1300 is the second state (i.e. the memory state D) (Step S1708). If the first resistance Ra is equal to ($R1_{SET}$+$R2_{RESET}$), it is determined that the state of the resistive memory 1300 is the third state (i.e. the memory state A) (Step S1710).

Figure 18:
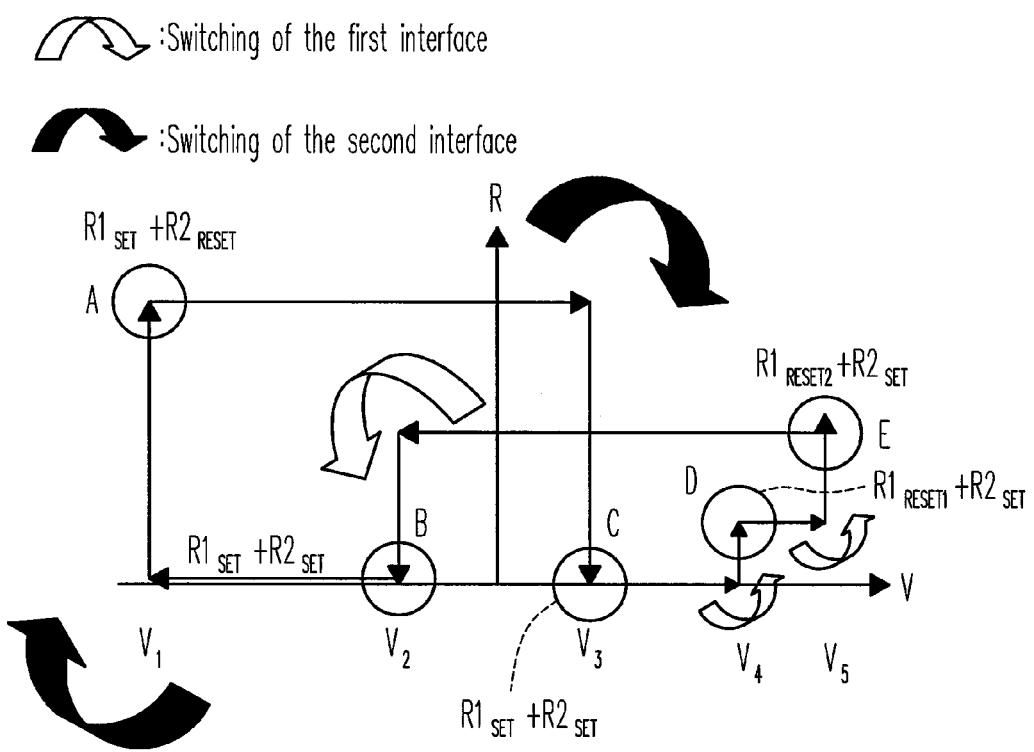
FIG. 18 is a diagram illustrating the switching of memory states of the resistive memory according to an embodiment of the present invention.

Please refer to FIGS. 13 and 18. FIG. 18 is a diagram illustrating the switching of memory states of the resistive memory 1300 according to an embodiment of the present invention. The horizontal axis represents the value of the voltage V applied to the first biasing layer 140, and the vertical axis represents resistance between the first interface 1212 and the second interface 1214. As compared with the embodiment of FIG. 16, the first interface 1212 of the present embodiment has one more resistive state. In other words, the first interface 1212 of the present embodiment has three resistive states, and the first interface 1212 of the embodiment of FIG. 16 has two resistive states. The resistances corresponding to the three resistive states of the first interface 1212 of the present embodiment are respectively $R1_{SET}$, $R1_{RESET1}$, and $R1_{RESET2}$. Therefore, the resistive memory 1300 of the present embodiment has five memory states which are labeled by the characters A, B, C, D, and E respectively. The states A, B, and C of the present embodiment are the same as those of the embodiment of FIG. 16, the state D of the present embodiment corresponds to the fourth value $V_4$ and the sum of resistances ($R1_{SET1}+R2SET$) and the state E of the present embodiment corresponds to a fifth value $V_5$ and the sum of resistances ($R1_{RESET2}+R2_{SET}$). In the present embodiment, the values of $R2_{RESET}$, $R1_{RESET1}$ and $R1_{RESET2}$ are different, and the value of $R1_{RESET}$ is equal to that of $R2_{RESET}$. Therefore, the sum of the resistances ($R1_{SET}+R2_{SET}$) corresponding to the memory state B is equal to that corresponding to the memory state C, and the sums of the resistances (R1SET+$R2_{RESEt}$), ($R1_{RESET1}+R2_{SET}$) and ($R1_{RESET2}+R2_{SET}$) respectively corresponding to the memory states A, D and E are different. Therefore, in the present embodiment, four memory states of the resistive memory 1300 are distinguishable according to the first resistance Ra directly.

Figure 19:
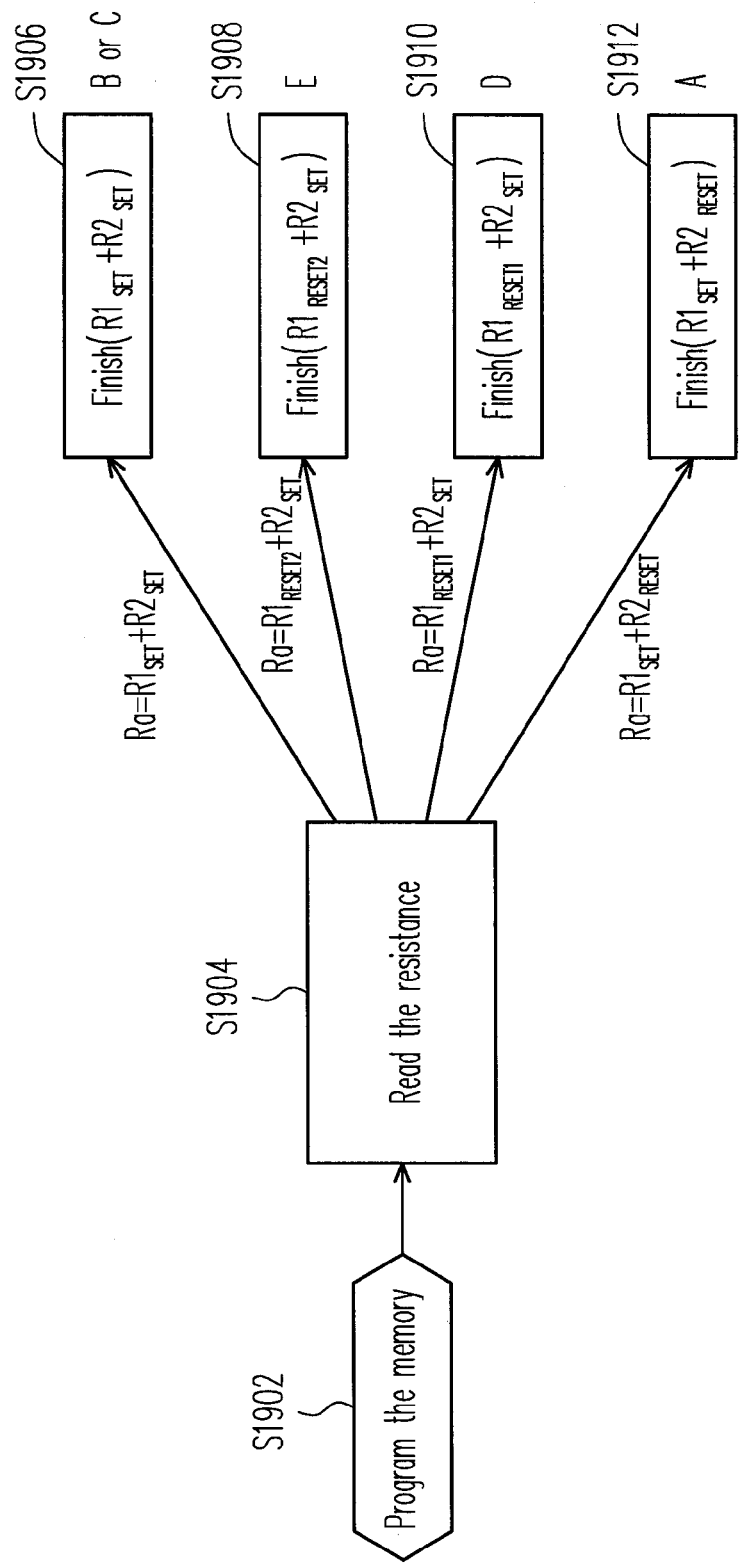
FIG. 19 is a flow chart of a method for controlling the operations of the resistive memory having the relationships illustrated in FIG. 18.

Please refer to FIG. 19, which is a flow chart of a method for controlling the operations of the resistive memory 1300 having the relationships illustrated in FIG. 18. In step S1902, the resistive memory 1300 is programmed. Then, in step S1904, the resistance between the first interface 1212 and the second interface 1214 is measured as the first resistance Ra while the first voltage is applied to the first biasing layer 140. If the first resistance Ra is equal to ($R1_{SET}+R2_{SET}$), it is determined that the state of the resistive memory 1300 is a first state (i.e. the memory state B or C) (Step S1906). If the first resistance Ra is equal to ($R1_{RESET2}+R2_{SET}$), it is determined that the state of the resistive memory 1300 is a second state (i.e. the memory state E) (Step S1908). If the first resistance Ra is equal to ($R1_{RESET1}+R2_{SET}$), it is determined that the state of the resistive memory 1300 is a third state (i.e. the memory state D) (Step S1910). If the first resistance Ra is equal to ($R1_{SET}+R2_{RESET}$), it is determined that the state of the resistive memory 1300 is a fourth state (i.e. the memory state A) (Step S1912).

Figure 20:
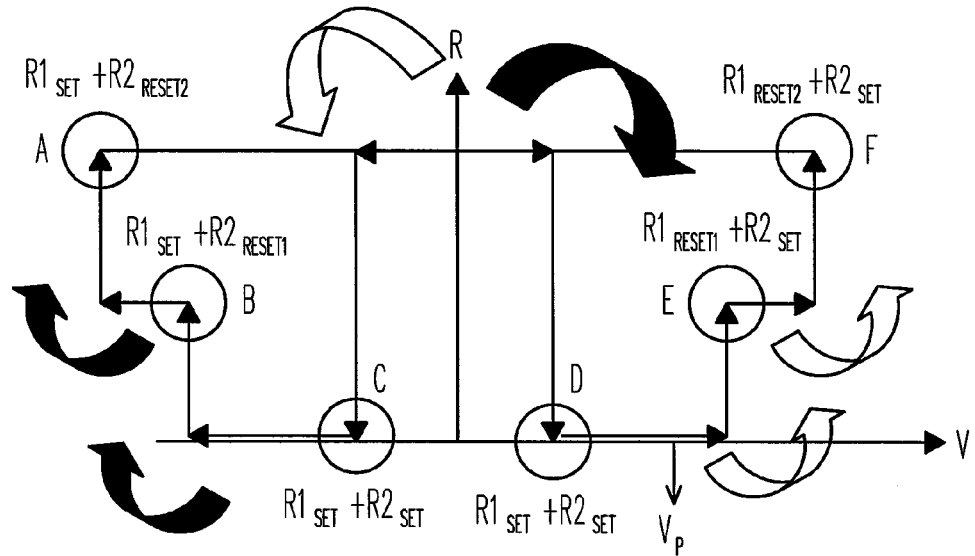
FIG. 20 is a diagram illustrating the switching of memory states of the resistive memory according to an embodiment of the present invention.

Please refer to FIGS. 13 and 20. FIG. 20 is a diagram illustrating the switching of memory states of the resistive memory 1300 according to an embodiment of the present invention. The horizontal axis represents the value of the voltage V applied to the first biasing layer 140, and the vertical axis represents resistance between the first interface 1212 and the second interface 1214. As compared with the embodiment of FIG. 18, the second interface 1214 of the present embodiment has one more resistive state. In other words, the second interface 1214 of the present embodiment has three resistive states, and the second interface 1214 of the embodiment of FIG. 18 has two resistive states. The resistances corresponding to the three resistive states of the first interface 1212 of the present embodiment are respectively $R1_{SET}$, $R1_{RESET1}$, and $R1_{RESET2}$. The resistances corresponding to the three resistive states of the second interface 1214 of the present embodiment are respectively $R2_{SET}$, $R2_{RESET1}$, and $R2_{RESET2}$. The resistive memory 1300 of the present embodiment has six memory states which are labeled by the characters A, B, C, D, E and F respectively.

Figure 21:
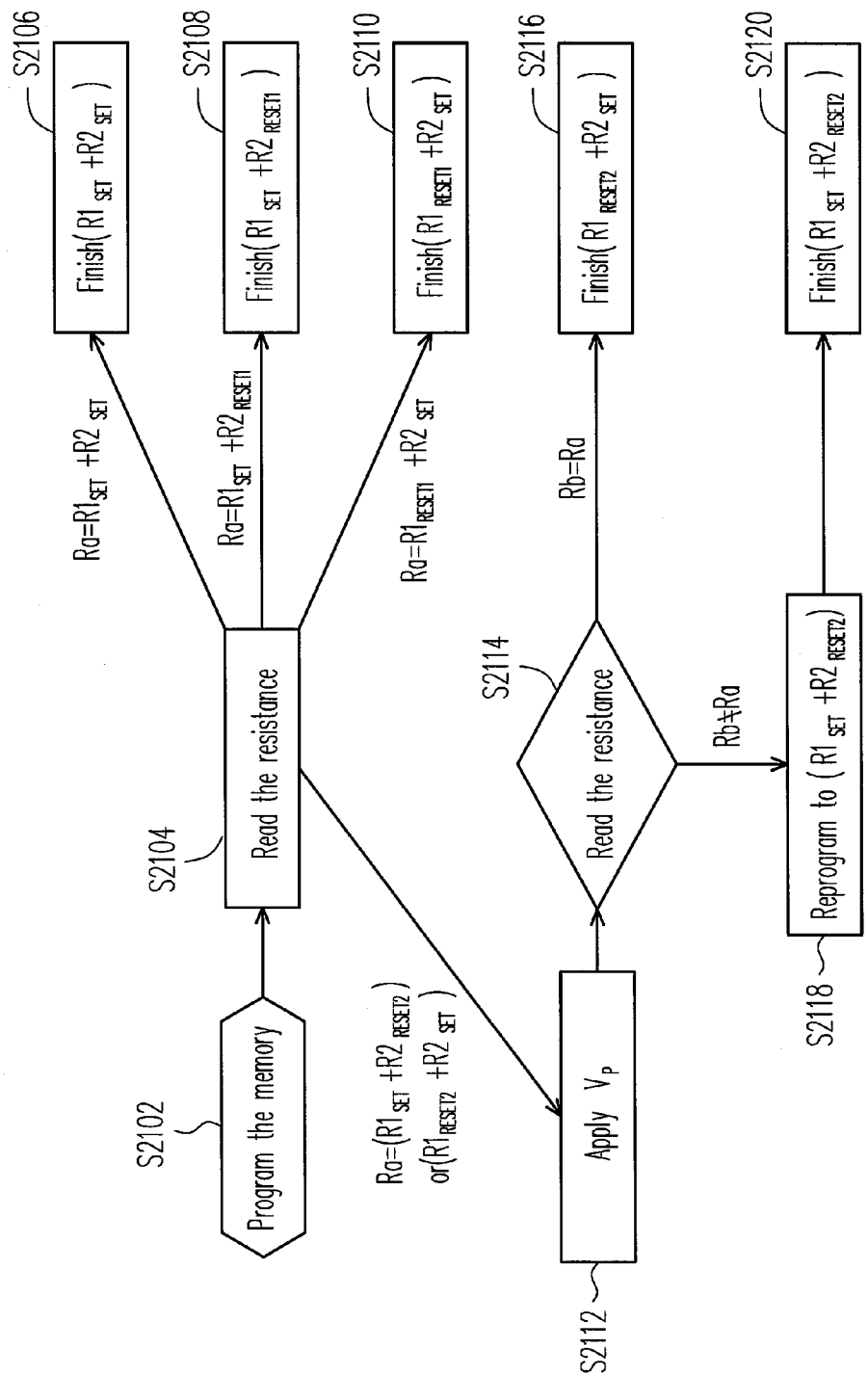
FIG. 21 is a flow chart of a method for controlling the operations of the resistive memory having the relationships illustrated in FIG. 20.

Please refer to FIG. 21, which is a flow chart of a method for controlling the operations of the resistive memory 1300 having the relationships illustrated in FIG. 20. In step S2102, the resistive memory 1300 is programmed. Then, in step S2104, the resistance between the first interface 1212 and the second interface 1214 is measured as the first resistance Ra while the first voltage is applied to the first biasing layer 140. If the first resistance Ra is equal to ($R1_{SET}+R2_{SET}$), it is determined that the state of the resistive memory 1300 is a first state (i.e. the memory state C or D) (Step S2106). If the first resistance Ra is equal to ($R1_{SET}+R2_{RESET1}$), it is determined that the state of the resistive memory 1300 is a second state (i.e. the memory state B) (Step S2108). If the first resistance Ra is equal to ($R1_{RESET1}+R2_{SET}$), it is determined that the state of the resistive memory 1300 is a third state (i.e. the memory state E) (Step S2110).

In the present embodiment, the predetermined value is equal to ($R1_{SET}+R2_{SET}$), ($R1_{SET}+R2_{RESET1}$) or ($R1_{RESET1}+R2_{SET}$). If the first resistance Ra is not equal to the predetermined value, then a second voltage Vp is applied to the first biasing layer 140 (Step S2112). In step S2114, the resistance between the first interface 1212 and the second interface 1214 is measured again. The resistance measured in step S2114 is regarded as a second resistance Rb. If the second resistance Rb is equal to the first resistance Ra, it means that the state of the resistive memory 1300 is not changed after the second voltage Vp is applied, such that it could be determined that the state of the resistive memory 1300 is a fourth state (i.e. the memory state F) (Step S2116). If the second resistance Rb is not equal to the first resistance Ra, it means that the state of the resistive memory 1300 is changed after the second voltage Vp is applied, such that it could be determined that the state of the resistive memory 1300 is a fifth state (i.e. the memory state A) (Step S2120). Since the state of the resistive memory 1300 may be changed in step S2114 if the second resistance Rb is not equal to the first resistance Ra, the resistive memory 1300 would be reprogrammed to be the fifth state (i.e. the memory state A) in step S2118.

According to the embodiments of FIGS. 4A-11 and 14A-21, it could be concluded that a total of distinguishable memory states of the resistive memory is at least to (N1+N2−1), where the number N1 is the number of resistive states of the first memory layer, and the number N2 is the number of resistive states of the second memory layer.

In the embodiments of the present invention, the resistive memory has two memory layers, each of which is capable of storing data. Accordingly, the total data amount could be stored by the resistive memory is increased. Moreover, since the total data amount is increased, the cost of each storage unit (e.g. 1 gigabyte) of the resistive memory could be reduced.

In addition, the above resistive memory 200 or 300 of CBRAM (conductive-bridging RAM) type, or the above resistive memory 1200 or 1300 of TMO (transition metal oxide) type, can be used as a memory unit to construct a resistive memory array, wherein each memory unit can be considered as a stack of two resistive memory cells.

Figure 22:
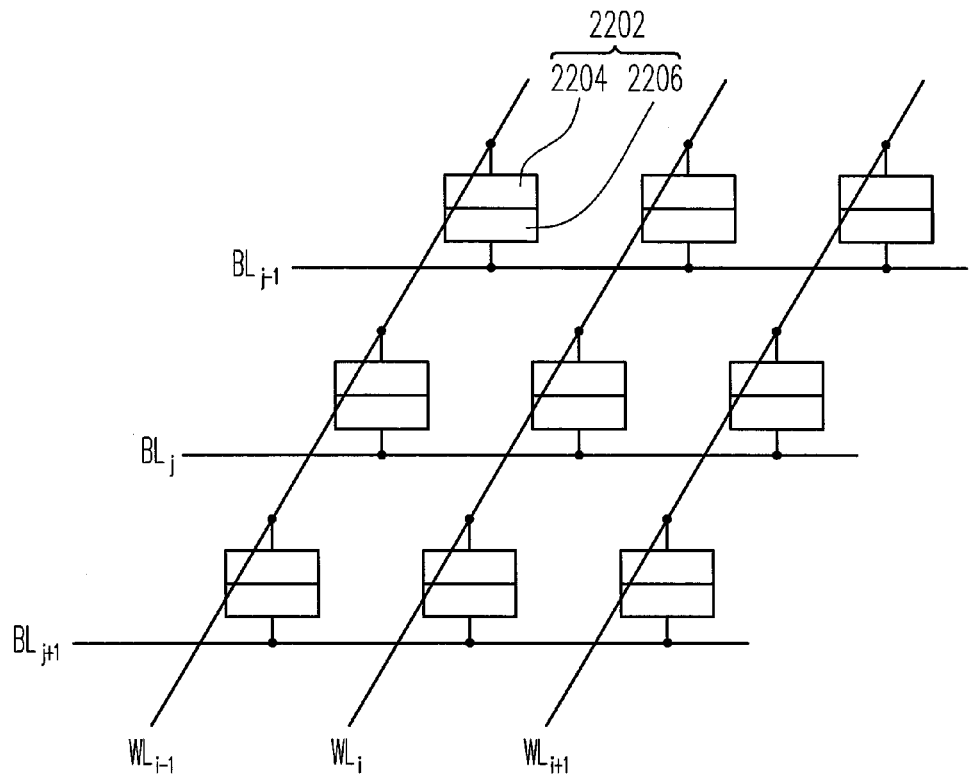
FIG. 22 is a structural diagram of a resistive memory array according to an embodiment of the present invention.

FIG. 22 is a structural diagram of a resistive memory array according to an embodiment of the present invention.

Referring to FIG. 22, the resistive memory array includes a plurality of resistive memory units 2202 arranged in rows and columns, a plurality of word lines (WL), and a plurality of bit lines (BL). Each resistive memory unit 2202 includes a first memory cell 2204, and a second memory cell 2206 disposed under and electrically connected in series with the first memory cell 2204. Each word line (WL) is coupled to the first memory cells 2204 of a row of the resistive memory units 2202. Each bit line (BL) is coupled to the second memory cells 2206 of a column of the resistive memory units 2202. Such an array design can be called a 2D cross-point array.

Referring to FIGS. 22 & 2-3, the resistive memory unit 2202 may be the above resistive memory 200 or 300, wherein the first solid electrolyte 210 is a part of the first memory cell 2204, and the second solid electrolyte 230 is a part of the second memory cell 2206.

Referring to FIGS. 22 & 12-13, the resistive memory unit 2202 may alternatively be the above resistive memory 1200 or 1300, wherein the first interface 1212 is a part of the first memory cell 2204, and the second interface 1214 is a part of the second memory cell 2206.

When the resistive memory unit 2202 is the above resistive memory 200 or 300, the resistive memory array can be programmed by the following steps. A resistive memory unit to be programmed is selected by selecting the corresponding word line and bit line. The selected resistive memory unit is then programmed according to one of the program paths illustrated in FIG. 4C or 6C to be at one of the state A, the state B or C, and the state D. All the states A, B (or C) and D can be used in this case, because at each of the states, the first memory cell 2204 and the second memory cell 2206 are not simultaneously at their low-resistance ($R_{SET}$) states so that a sneaking current can be prevented in the 2D cross-point array as illustrated in FIG. 22.

Thereafter, in a read operation, a resistive memory unit 2202 to be read can be selected via the corresponding word line and bit line and then determined for its state using the algorithm illustrated in FIG. 5 or 7.

When the resistive memory unit 2202 is the above TMO-type resistive memory 1200 or 1300, the resistive memory array can be programmed by the following steps. A resistive memory unit to be programmed is selected via the corresponding word line and bit line. The selected resistive memory unit is then programmed by a program path illustrated in FIG. 14E or 16 to be at one of the state A and the state D. The state B or C cannot be used in this case, because the first memory cell 2204 and the second memory cell 2206 are simultaneous at their low-resistance ($R_{SET}$) states at the state B or C so that a large sneaking current occurs. Accordingly, the read algorithm is different from that illustrated in FIG. 15 or 17.

The read algorithm for the resistive memory array where the resistive memory unit 2202 is the above resistive memory 1300 and has the relationships illustrated in FIGS. 14A-14E is taken as an example, which lacks certain steps as compared to that illustrated in FIG. 15 because the states B and C are not used in the programming.

Figure 23:
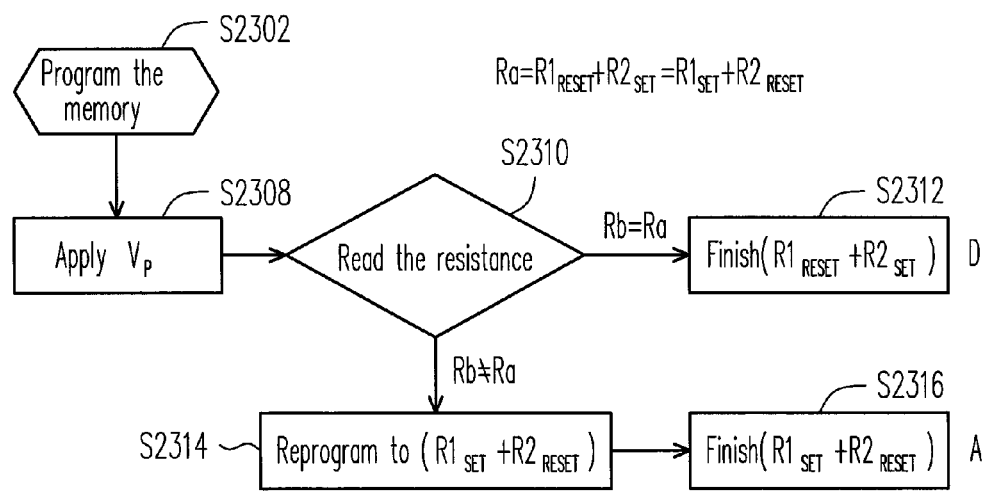
FIG. 23 is a flow chart of a method for controlling operations of a resistive memory array that includes a plurality of the resistive memory units illustrated in FIG. 12 or 13 and has the array structure illustrated in FIG. 22.

Referring to FIGS. 23, 13 and 14E, in step S2302, the resistive memory unit 1300 is programmed to one of the state A and the state D. In step S2308, a read voltage Vp as shown in FIG. 14E is applied to the first biasing layer 140. In next step S2310, the resistance between the first interface 1212 and the second interface 1214 is measured and regarded as a read resistance Rb. If Rb is equal to Ra (=$R1_{RESET}$+$R2_{SET}$ or $R1_{SET}$+$R2_{RESET}$, also seen in FIG. 15), it means that the state of the resistive memory unit 1300 is not changed after the read voltage Vp is applied, so that the state of the resistive memory unit 1300 can be determined to be the state D (step S2312). If Rb is not equal to Ra, it means that the state of the resistive memory unit 1300 is changed after the read voltage Vp is applied, so that the state of the resistive memory unit 1300 can be determined to be the state A (step S2316). Because the state of the resistive memory unit 1300 may be changed in step S2308 if Rb is not equal to Ra, the resistive memory unit 1300 would be reprogrammed to be the state A in step S2314.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A resistive memory array, comprising:
 a plurality of resistive memory units arranged in rows and columns, wherein each of the resistive memory units comprises a first memory cell, and a second memory cell disposed under and electrically connected in series with the first memory cell, wherein each of the resistive memory units includes:
 a first solid electrolyte, being a part of the first memory cell;
 a second solid electrolyte, being a part of the second memory cell; and
 an oxidizable electrode, formed between the first solid electrolyte and the second solid electrolyte,
 wherein the first solid electrolyte and the second solid electrolyte are made of a transition metal oxide or a material containing at least one chalcogenide element;
 a plurality of word lines, wherein each of the word lines is coupled to the first memory cells of a row of the resistive memory units; and
 a plurality of bit lines, wherein each of the bit lines is coupled to the second memory cells of a column of the resistive memory units.

2. The resistive memory array of claim 1, wherein the oxidizable electrode is made of a material selected from the group consisting of silver, copper and zinc.

3. The resistive memory array of claim 1, further comprising:
 a composing layer having two silicon oxide spacers and a tungsten layer formed between the two silicon oxide spacers, wherein the second solid electrolyte is formed between the oxidizable electrode and the composing layer.

4. The resistive memory array of claim 3, further comprising:
 a titanium nitride layer, an inter-metal dielectric (IMD) layer, and a substrate, wherein the titanium nitride layer is formed between the composing layer and the IMD layer, and the IMD layer is formed between the titanium nitride layer and the substrate.

5. A method for controlling operations of a resistive memory array of claim 1, comprising:
 (a) selecting, via a word line and a bit line, a resistive memory unit to be operated; and
 (b) measuring a resistance of the selected resistive memory unit and determining which one of a first state, a second state and a third state is a state of the selected resistive memory unit according to the measured resistance.

6. The method of claim 5, wherein the step (b) comprises:
 measuring the resistance as a first resistance by applying a first voltage to the selected resistive memory unit;
 determining that the state of the resistive memory unit is the first state when the first resistance is equal to a predetermined value;
 when the first resistance is different from the predetermined value, measuring the resistance as a second resistance by applying a second voltage to the selected resistive memory unit; and
 determining that the state of the selected resistive memory unit is the second state when the second resistance is equal to the first resistance, or determining that the state of the selected resistive memory unit is the third state when the second resistance is not equal to the first resistance.

7. The method of claim 6, further comprising:
reprogramming the selected resistive memory unit to be at the third state when the state of the selected resistive memory unit is determined as the third state.

8. The method of claim 7, wherein the first voltage is less than the second voltage.

9. A resistive memory array, comprising:
a plurality of resistive memory units arranged in rows and columns, wherein each of the resistive memory units comprises a first memory cell, and a second memory cell disposed under and electrically connected in series with the first memory cell, wherein each of the resistive memory units includes:
a first barrier layer;
a second barrier layer; and
a metal oxide layer, formed between the first barrier layer and the second barrier layer;
wherein a first active region is between the first barrier layer and the metal oxide layer and is a part of the first memory cell, and a second active region is between the second barrier layer and the metal oxide layer and is a part of the second memory cell;
a plurality of word lines, wherein each of the word lines is coupled to the first memory cells of a row of the resistive memory units; and
a plurality of bit lines, wherein each of the bit lines is coupled to the second memory cells of a column of the resistive memory units.

10. The resistive memory array of claim 9, wherein the first barrier layer and the second barrier layer are made of a material selected from a group consisting of titanium nitride (TiN), tantalum nitride (TaN), platinum (Pt), and gold (Au), and the metal oxide layer is made of a material selected from a group consisting of tungsten oxide, titanium oxide, nickel oxide, aluminum oxide, cupric oxide, zirconium oxide, niobium oxide, and tantalum oxide.

11. The resistive memory array of claim 9, wherein each of the first active region and the second active region has two resistive states.

12. The resistive memory array of claim 9, further comprising:
two silicon oxide spacers, a first electrode, a second electrode, an inter-metal dielectric (IMD) layer, and a substrate, wherein the two silicon oxide spacers are contacted with the metal oxide layer and formed between the first barrier layer and the second barrier layer, the first electrode is formed on the first barrier layer, the second electrode is formed between the second barrier layer and the IMD layer, and the IMD layer is formed between the second electrode and the substrate.

13. The resistive memory array of claim 12, wherein the first electrode and the second electrode are made of an aluminum-copper alloy.

14. A method for controlling operations of a resistive memory array of claim 9, comprising:
(a) programming the resistive memory array such that in each of the resistive memory units, the first memory cell and the second memory cell are not simultaneously at low-resistance states;
(b) selecting, via a word line and a bit line, a memory unit to be operated; and
(c) measuring a resistance of the selected resistive memory unit, and determining which one of a first state and a second state is a state of the selected resistive memory unit according to the measured resistance.

15. The method of claim 14, wherein the step (c) comprises:
measuring the resistance as a read resistance by applying a read voltage to the selected resistive memory unit; and
determining that the state of the selected resistive memory unit is the first state when the read resistance is equal to a predetermined value, or determining that the state of the selected resistive memory unit is the second state when the read resistance is not equal to the predetermined value.

16. The method of claim 15 further comprising:
reprogramming the selected resistive memory unit to be at the second state when the state of the selected resistive memory unit is determined as the second state.

* * * * *